(12) United States Patent
Ho et al.

(10) Patent No.: US 12,550,473 B2
(45) Date of Patent: Feb. 10, 2026

(54) BACK-TRENCH ISOLATION STRUCTURE

(71) Applicant: Taiwan Semiconductor Manufacturing Company, Ltd., Hsinchu (TW)

(72) Inventors: Cheng-Ying Ho, Minxiong Township (TW); Wen-De Wang, Minsyong Township (TW); Kai-Chun Hsu, Yonghe (TW); Sung-En Lin, Taoyuan (TW); Yuh-Ruey Huang, Hsinchu County (TW); Jen-Cheng Liu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 740 days.

(21) Appl. No.: 17/866,846

(22) Filed: Jul. 18, 2022

(65) Prior Publication Data

US 2023/0378221 A1 Nov. 23, 2023

Related U.S. Application Data

(60) Provisional application No. 63/342,648, filed on May 17, 2022.

(51) Int. Cl.
*H10F 39/00* (2025.01)

(52) U.S. Cl.
CPC ......... *H10F 39/811* (2025.01); *H10F 39/014* (2025.01); *H10F 39/024* (2025.01); *H10F 39/80373* (2025.01); *H10F 39/807* (2025.01)

(58) Field of Classification Search
CPC .... H10F 39/811; H10F 39/014; H10F 39/024; H10F 39/80373; H10F 39/80
See application file for complete search history.

(56) References Cited

U.S. PATENT DOCUMENTS

| | | | |
|---|---|---|---|
| 2008/0087977 | A1 | 4/2008 | Watanabe |
| 2011/0079866 | A1 | 4/2011 | Nishizawa et al. |
| 2014/0054662 | A1 | 2/2014 | Yanagita et al. |
| 2016/0056188 | A1 | 2/2016 | Lee et al. |
| 2018/0190707 | A1* | 7/2018 | Lee ................... H10F 39/8037 |
| 2018/0286922 | A1* | 10/2018 | Togashi ............ H10F 39/199 |
| 2018/0301509 | A1* | 10/2018 | Ishii ................... H04N 25/78 |

(Continued)

FOREIGN PATENT DOCUMENTS

| | | |
|---|---|---|
| JP | 2007329336 A | 12/2007 |
| KR | 20210130868 A | 11/2021 |

*Primary Examiner* — Samuel A Gebremariam
(74) *Attorney, Agent, or Firm* — Eschweiler & Potashnik, LLC

(57) ABSTRACT

The present disclosure relates to an image sensor integrated chip (IC). The image sensor IC includes one or more interconnects arranged within an inter-level dielectric (ILD) structure on a first side of a substrate. An image sensing element is arranged within the substrate. Sidewalls of the substrate form one or more trenches extending from a second side of the substrate to within the substrate on opposing sides of the image sensing element. A dielectric structure is arranged on the sidewalls of the substrate that form the one or more trenches. A conductive core is arranged within the one or more trenches and is laterally separated from the substrate by the dielectric structure. The conductive core is electrically coupled to the one or more interconnects.

20 Claims, 25 Drawing Sheets

(56) References Cited

U.S. PATENT DOCUMENTS

| | | |
|---|---|---|
| 2018/0337211 A1 | 11/2018 | Su et al. |
| 2019/0131336 A1 | 5/2019 | Yoon et al. |
| 2019/0165026 A1* | 5/2019 | Kuo ................. H10F 39/807 |
| 2020/0161450 A1* | 5/2020 | Huang ............. H01L 21/76843 |
| 2020/0296313 A1 | 9/2020 | Nishino |
| 2020/0387050 A1 | 12/2020 | Pyo et al. |
| 2021/0273003 A1 | 9/2021 | Lan et al. |
| 2021/0273123 A1 | 9/2021 | Yang et al. |
| 2021/0335862 A1 | 10/2021 | Lee et al. |
| 2022/0102405 A1 | 3/2022 | Kim et al. |

* cited by examiner

BACK-TRENCH ISOLATION STRUCTURE

REFERENCE TO RELATED APPLICATION

This application claims the benefit of U.S. Provisional Application No. 63/342,648, filed on May 17, 2022, the contents of which are hereby incorporated by reference in their entirety.

BACKGROUND

Integrated circuits (IC) with image sensors are used in a wide range of modern-day electronic devices, such as cameras and cell phones, for example. In recent years, complementary metal-oxide semiconductor (CMOS) image sensors have begun to see widespread use, largely replacing charge-coupled device (CCD) image sensors. Compared to CCD image sensors, CMOS image sensors are increasingly favored due to low power consumption, a small size, fast data processing, a direct output of data, and low manufacturing cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
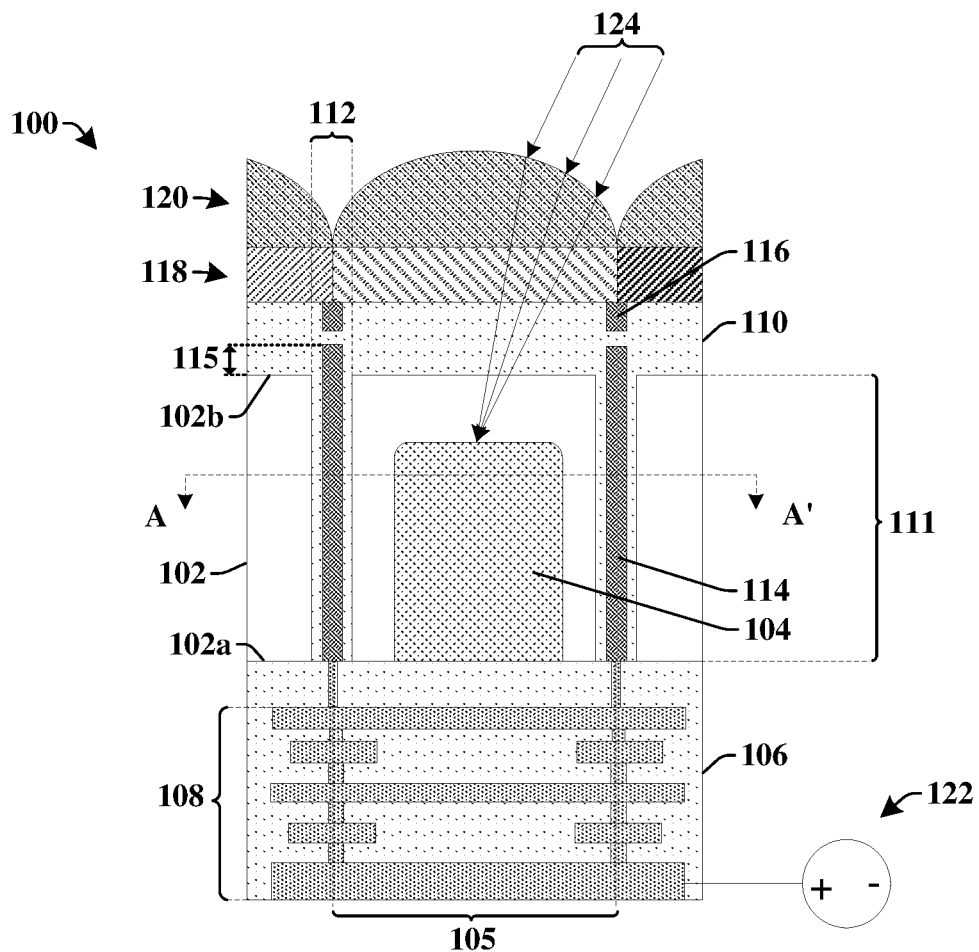
FIG. 1 illustrates a cross-sectional view of some embodiments of an image sensor integrated chip (IC) having an image sensing element surrounded by a back-trench isolation (BTI) structure with a conductive core configured to be biased.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many electronic devices (e.g., cameras, cellular telephones, computers, etc.) include one or more image sensor integrated chips (ICs) comprising image sensing elements configured to capture images. An image sensor IC may contain a large array of pixel regions respectively including an image sensing element disposed within a semiconductor substrate. The pixel regions are electrically isolated from one another by isolation structures (e.g., deep trench isolation structures). The isolation structures comprise an insulating material disposed within a trench in the semiconductor substrate.

During fabrication of an isolation structure, a semiconductor substrate may be etched to form a trench, which is subsequently filled with one or more dielectric materials. The etching processes used to form the trench can damage the semiconductor substrate, resulting in defects (e.g., dangling bonds, etc.) along interior surfaces of the semiconductor substrate defining the trench. The defects may trap charge carriers (e.g., electrons) and cause an unwanted leakage current to flow between adjacent pixel regions, leading to dark current and/or white pixel issues within the image sensor IC.

Such defects may be passivated by forming a high-k dielectric material along sidewalls of the semiconductor substrate defining the trench. For example, the high-k dielectric material may form an electric field that accumulates holes along the sidewalls of the semiconductor substrate and thereby passivates the charge carriers (e.g., electrons). However, it has been appreciated that the electric field provided by such high-k dielectric materials may not be strong enough to achieve a sufficient hole density to effectively passivate the charge carriers trapped in the defects. Therefore, an image sensor IC having a high-k dielectric material along sidewalls of a trench used in an isolation structure may still suffer from performance degradation due to dark current and/or white pixel issues.

The present disclosure relates to an image sensor integrated chip (IC). In some embodiments, the image sensor IC may comprise a plurality of interconnects disposed within a dielectric structure on a first side of a substrate. An isolation structure is disposed within a trench in the substrate. The trench surrounds an image sensing element arranged within the substrate. The isolation structure comprises a dielectric material surrounding a conductive core that vertically extends from a second side of the substrate to within the substrate. The conductive core is electrically coupled to the plurality of interconnects. The plurality of interconnects are further coupled to a biasing source configured to apply a bias voltage to the conductive core. By applying a bias voltage to the conductive core, the conductive core is able to generate an electric field that accumulates holes along sidewalls of the substrate defining the trench. The holes are configured to passivate defects within the sidewalls of the substrate, thereby improving performance of the image sensor IC.

FIG. 1 illustrates a cross-sectional view of some embodiments of an image sensor integrated chip (IC) 100 having an image sensing element surrounded by a back-trench isolation (BTI) structure with a conductive core configured to be biased.

The image sensor IC 100 comprises a substrate 102 having a first side 102a (e.g., a front-side) and a second side 102b (e.g., a back-side) opposing the first side 102a. An image sensing element 104 is disposed within a pixel region 105 of the substrate 102. The image sensing element 104 is configured to convert incident radiation 124 to an electrical signal. The substrate 102 comprises sidewalls that form one or more trenches 112 extending from the second side 102b of the substrate 102 to within the substrate 102. In some embodiments, the one or more trenches 112 may extend from the second side 102b of the substrate 102 to the first side 102a of the substrate 102.

An inter-level dielectric (ILD) structure 106 is arranged on the first side 102a of the substrate 102. In some embodiments, the ILD structure 106 comprises one or more inter-level dielectric (ILD) layers stacked onto one another. The ILD structure 106 surrounds one or more interconnects 108. In some embodiments, the one or more interconnects 108 may comprise a conductive contact, a middle-end-of-the-line (MEOL) interconnect, an interconnect wire, and/or an interconnect via.

A dielectric structure 110 is arranged along the second side 102b of the substrate and along the sidewalls of the substrate 102 defining the one or more trenches 112. In some embodiments, the dielectric structure 110 may continuously extend from the second side 102b of the substrate 102 to along the along the sidewalls of the substrate 102 defining the one or more trenches 112. A conductive core 114 is arranged within the one or more trenches 112 and is laterally separated from the substrate 102 by the dielectric structure 110. The conductive core 114 is electrically coupled to the one or more interconnects 108. The conductive core 114 vertically extends past a top of the image sensing element 104 that faces away from the ILD structure 106. In some embodiments (not shown), the conductive core 114 extends vertically past a bottom of the dielectric structure 110 that is within the one or more trenches 112. The dielectric structure 110 and the conductive core 114 form an isolation structure 111 within the one or more trenches 112.

A grid structure 116 is disposed over the conductive core 114. The dielectric structure 110 laterally surrounds the grid structure 116. In some embodiments, the conductive core 114 vertically protrudes outward to a non-zero distance 115 past the second side 102b of the substrate 102 and towards the grid structure 116. Having the conductive core 114 extend outward past the second side 102b of the substrate 102 improves isolation between the pixel region 105 and an adjacent pixel region, by blocking incident radiation that may laterally travel between adjacent pixel regions over a vertical span that is between the second side 102b of the substrate 102 and the grid structure 116. In some embodiments, the non-zero distance 115 may be in a range of between approximately 500 Angstroms (Å) and approximately 5000 Å, between approximately 1000 Å and approximately 5000 Å, or other similar values.

In some embodiments, a color filter 118 is disposed on the second side 102b of the substrate 102 and a micro-lens 120 is arranged on the color filter 118. The micro-lens 120 has a curved surface facing away from the substrate 102. The curved surface is configured to focus incident radiation 124 to the image sensing element 104.

A biasing source 122 is coupled to the conductive core 114 by way of the one or more interconnects 108. The biasing source 122 is configured to selectively apply a bias voltage to the conductive core 114 (e.g., during operation of the image sensing element 104). By selectively apply a bias voltage to the conductive core 114, the conductive core 114 is able to generate an electric field that attracts holes towards the sidewalls of the substrate 102 defining the one or more trenches 112. The holes accumulate along the sidewalls and passivate defects (e.g., traps) along the sidewalls of the substrate 102. Passivating the defects may improve isolation between the pixel region 105 and an adjacent pixel region, improve a modulation transfer function (MTF) of the image sensing element 104, and/or provide a good quantum efficiency for incident radiation that is in the infrared part of the electromagnetic spectrum (e.g., that has a wavelength of approximately 940 nm).

Figure 2:
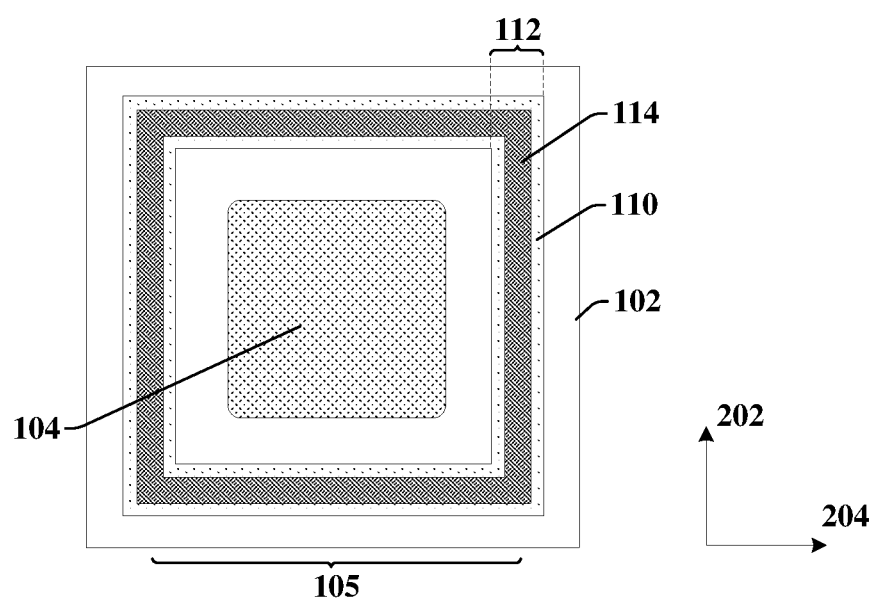
FIG. 2 illustrates a top-view of some embodiments of an image sensor IC having an image sensing element surrounded by a BTI structure with a conductive core.

FIG. 2 illustrates a top-view 200 (e.g., taken along cross-sectional line A-A' of FIG. 1) of some embodiments of an image sensor IC having an image sensing element surrounded by a BTI structure with a conductive core.

As shown in top-view 200, an image sensing element 104 is disposed within a pixel region 105 of a substrate 102. The image sensing element 104 may comprise a rectangular shape (e.g., a square shape, a rounded square shape, or the like). One or more trenches 112 wrap around the image sensing element 104 in a closed and unbroken path (e.g., loop). The one or more trenches 112 are formed by sidewalls of the substrate 102 that extend in a first direction 202 and in a second direction 204, which is perpendicular to the first direction 202.

A dielectric structure 110 is arranged along opposing sidewalls of the one or more trenches 112. The dielectric structure 110 separates the substrate 102 from a conductive core 114 within the one or more trenches 112. The dielectric structure 110 and the conductive core 114 also continuously wrap around the image sensing element 104 in closed and unbroken paths (e.g., loops).

Figure 3:
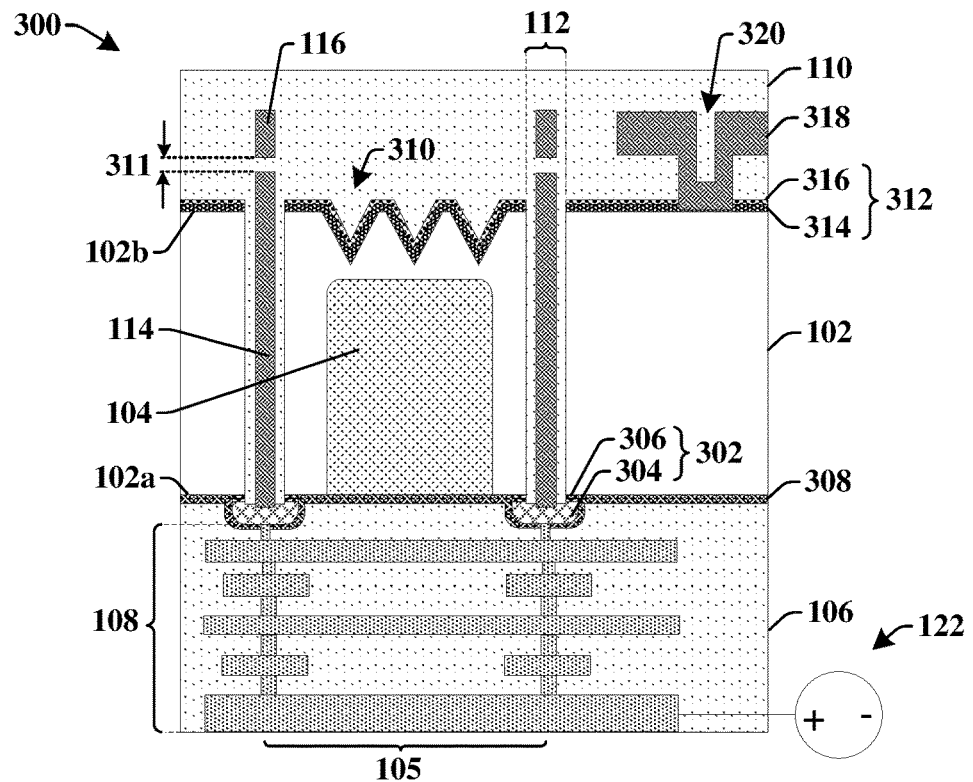
FIG. 3 illustrates a cross-sectional view of some additional embodiments of an image sensor IC having a BTI structure with a conductive core.

FIG. 3 illustrates a cross-sectional view of some additional embodiments of an image sensor IC 300 having a BTI structure with a conductive core.

The image sensor IC 300 comprises a substrate 102 having a first side 102a and a second side 102b. An image sensing element 104 is disposed within a pixel region 105 of the substrate 102. The substrate 102 comprises sidewalls that form one or more trenches 112 along opposing sides of the image sensing element 104. The one or more trenches 112 extend from the second side 102b of the substrate 102 to the first side 102a of the substrate 102.

One or more gate structures 302 are arranged along the first side 102a of the substrate 102. The one or more gate structures 302 are arranged directly below the one or more trenches 112. The one or more gate structures 302 respectively comprise a gate electrode 304 separated from the substrate 102 by a gate dielectric 306. The one or more gate structures 302 are coupled to one or more interconnects 108 disposed within an ILD structure 106 arranged on the first side 102a of the substrate 102. In some embodiments, the gate electrode 304 may comprise polysilicon, a metal, or the like. In various embodiments, the gate dielectric 306 may comprise an oxide (e.g., silicon oxide), a nitride (e.g., silicon oxynitride), or the like. In some embodiments, a contact etch stop layer (CESL) 308 extends along the first side 102a of the substrate 102 and covers the one or more gate structures 302. In various embodiments, the CESL 308 may comprise an oxide (e.g., silicon oxide), a nitride (e.g., silicon nitride, silicon oxynitride, etc.), a carbide (e.g., silicon carbide, silicon oxycarbide, etc.).

A second side 102b of the substrate 102 comprises a non-planar surface defining a plurality of recesses 310 arranged in a periodic pattern. The plurality of recesses 310 are laterally separated from one another by angled sidewalls of the substrate 102. In some embodiments, the angled sidewalls of the substrate 102 may form triangular shaped regions of the substrate 102, as viewed in the cross-sectional view of FIG. 3. In some embodiments, the plurality of recesses 310 comprise one or more triangular shaped cavities that are directly and vertically over the image sensing element 104 and that are directly and laterally between sidewalls of the conductive core 114. The plurality of recesses 310 define an absorption enhancement structure with a topography that increases absorption of incident radiation by the substrate 102 (e.g., by reducing a reflection of radiation from the non-planar surface). Increasing absorption of incident radiation by the substrate 102 increases a quantum efficiency (QE) of the image sensing element 104, and thereby improves performance of the image sensor IC 300.

In some embodiments, one or more absorption enhancement layers 312 are arranged over the second side 102b of the substrate 102 and within the plurality of recesses 310. In some embodiments, the one or more absorption enhancement layers 312 contact the substrate 102 along the non-planar surface. In some embodiments, the one or more absorption enhancement layers 312 comprise a first absorption enhancement layer 314 and a second absorption enhancement layer 316 on the first absorption enhancement layer 314. In some embodiments, the first absorption enhancement layer 314 may comprise a high-k dielectric material, such as hafnium oxide ($HfO_2$), titanium oxide ($TiO_2$), hafnium zirconium oxide (HfZrO), tantalum oxide ($Ta_2O_3$), hafnium silicon oxide ($HfSiO_4$), zirconium oxide ($ZrO_2$), zirconium silicon oxide ($ZrSiO_2$), or the like. In some embodiments, the second absorption enhancement layer 316 may comprise an oxide (e.g., silicon oxide), TEOS (tetraethyl orthosilicate), a nitride (e.g., silicon nitride, silicon oxynitride, etc.), a carbide (e.g., silicon carbide, silicon oxycarbide, etc.), or the like.

A dielectric structure 110 is arranged over the one or more absorption enhancement layers 312. The dielectric structure 110 may also extend to within the one or more trenches 112 in the substrate 102. In some embodiments, the dielectric structure 110 continuously extends from over the one or more absorption enhancement layers 312 to along the sidewalls of the substrate 102 defining the one or more trenches 112. In some such embodiments, the dielectric structure 110 may have a sidewall that covers the sidewalls of the substrate 102 and sidewalls of the one or more absorption enhancement layers 312. In some embodiments, the dielectric structure 110 may comprise or be an oxide (e.g., silicon oxide), a nitride (e.g., silicon nitride, silicon oxynitride, etc.), and/or the like. In some embodiments, the dielectric structure 110 may directly and physically contact the sidewalls of the substrate 102 that define the one or more trenches 112.

A conductive core 114 is arranged within the one or more trenches 112 and laterally between sidewalls of the dielectric structure 110. The conductive core 114 electrically contacts the one or more gate structures 302 arranged along the first side 102a of the substrate 102. In some embodiments, the conductive core 114 may physically contact the gate electrode 304. In some such embodiments, source/drain regions are not arranged along opposing sides of the one or more gate structures 302. In other embodiments (not shown), the conductive core 114 may be separated from gate electrode 304 by the gate dielectric 306. In such embodiments, the conductive core 114 may be electrically coupled to the one or more gate structures 302 through a channel region that is formed along the gate dielectric 306 (e.g., between source/drain regions disposed within the substrate 102) when a bias voltage is applied to the gate electrode 304. The conductive core 114 continuously extends from the one or more gate structures 302 to over a top of the one or more absorption enhancement layers 312. In some embodiments, the conductive core 114 may comprise or be a metal such as tungsten, aluminum, copper, or the like.

A grid structure 116 is arranged within the dielectric structure 110 over the conductive core 114. The dielectric structure 110 separates the grid structure 116 from the conductive core 114. In some embodiments, a top of the conductive core 114 is separated from a bottom of the grid structure 116 by a distance 311. In some embodiments, the distance 311 may be in a range of between approximately 500 Å and approximately 3000 Å, between approximately 1000 Å and approximately 3000 Å, or other similar values. Having the distance 311 less than approximately 3000 Å mitigates cross-talk between adjacent pixel regions.

In some embodiments, a conductive shield 318 is also arranged within the dielectric structure 110 outside of the pixel region 105. The conductive shield 318 is configured to block incident radiation, so as to prevent dark current due to the generation of unwanted charge carriers within the substrate 102. In some embodiments, the conductive shield 318 may have one or more sidewalls defining a divot 320 arranged within an upper surface of the conductive shield 318. In some embodiments, the dielectric structure 110 may extend to within the divot 320.

In some embodiments, the one or more absorption enhancement layers 312 are entirely outside of the one or more trenches 112. Having the one or more absorption enhancement layers 312 entirely outside of the one or more trenches 112, causes the first absorption enhancement layer 314 to not be disposed on the sidewalls of the substrate 102 defining the one or more trenches 112. Not having the first absorption enhancement layer 314 on the sidewalls of the substrate 102 allows for a fabrication cost of the image sensor IC 300 to be reduced since the cost to deposit the first absorption enhancement layer 314 along the sidewalls of the substrate 102 defining the one or more trenches is expensive. Furthermore, because the conductive core 114 is able to generate an electric field that passivates defects within the sidewalls of the substrate 102, the first absorption enhancement layer 314 is not needed to passivate the defects within the sidewalls of the substrate 102. Therefore, the image sensor IC 300 is able to provide for good performance and low fabrication cost.

Figure 4:
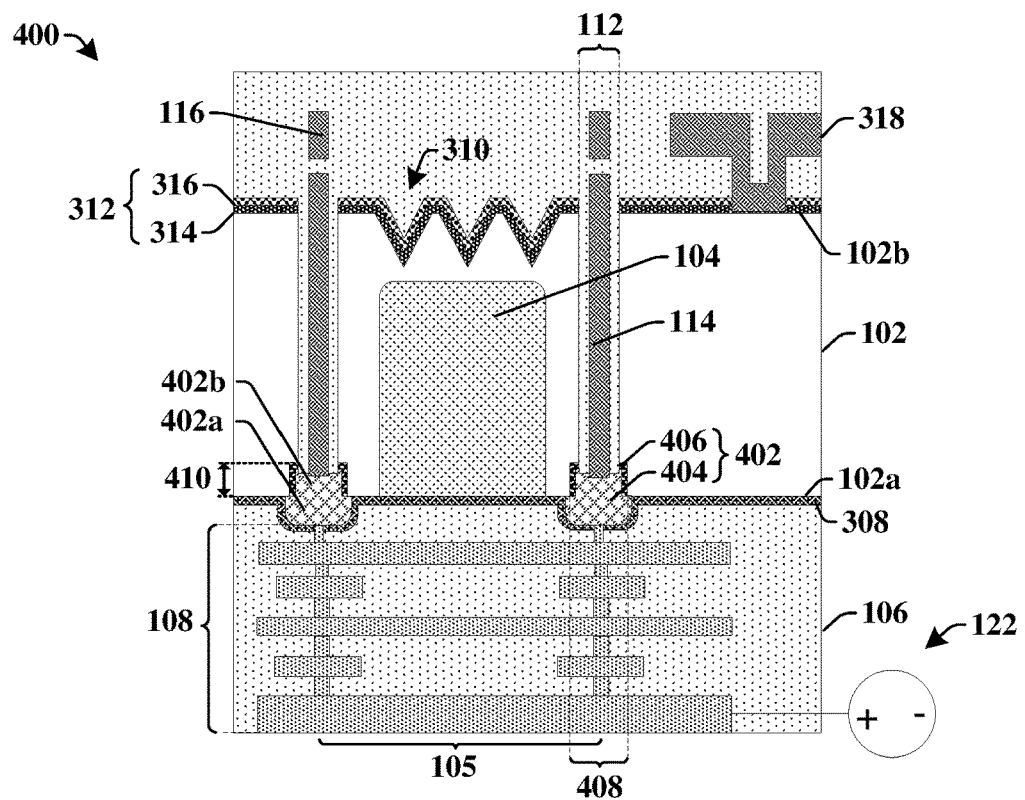
FIG. 4 illustrates a cross-sectional view of some additional embodiments of an image sensor IC having a BTI structure with a conductive core.

FIG. 4 illustrates a cross-sectional view of some additional embodiments of an image sensor IC 400 having a BTI structure with a conductive core.

The image sensor IC 400 comprises a substrate 102 having a first side 102a and a second side 102b. An image sensing element 104 is disposed within a pixel region 105 of the substrate 102. The substrate 102 comprises sidewalls that form one or more trenches 112 along opposing sides of the image sensing element 104. The one or more trenches 112 extend from the second side 102b of the substrate 102 to within the substrate 102.

One or more recessed gate structures 402 are arranged along the first side 102a of the substrate 102. In some embodiments, the one or more recessed gate structures 402 are coupled to one or more interconnects 108 disposed within an ILD structure 106 arranged on the first side 102a of the substrate 102. The one or more recessed gate structures 402 extend from along the first side 102a of the substrate 102 to within one or more gate recesses 408 within the first side 102a of the substrate 102, so that a part of the one or more recessed gate structures 402 are directly between sidewalls of the substrate 102. In some embodiments, the one or more recessed gate structures 402 extend to a first distance 410 within the substrate 102. In some embodiments, the first distance 410 may be in a range of between approximately 1000 Å and approximately 6000 Å, between approximately 1500 Å and approximately 5000 Å, between approximately 2000 Å and approximately 4000 Å, or other similar values.

The one or more recessed gate structures 402 respectively comprise a gate electrode 404 separated from the substrate 102 by a gate dielectric 406. In some embodiments, the gate electrode 404 may comprise polysilicon, a metal, or the like. In various embodiments, the gate dielectric 406 may comprise an oxide (e.g., silicon oxide), a nitride (e.g., silicon oxynitride), or the like.

In some embodiments, the one or more recessed gate structures 402 may comprise a first segment 402a that is outside of the substrate 102 and a second segment 402b that is within the substrate 102 (e.g., within the one or more gate recesses 408). The first segment 402a may laterally extend past outer sidewalls of the second segment 402b. In some embodiments, the one or more trenches 112 may respectively have a width that is substantially equal to a width of the second segment 402b. In other embodiments, the second segment 402b may have a width that is different than (e.g., larger than) a width of the one or more trenches 112. In some such embodiments, one or more horizontally extending surfaces of the substrate 102 extend between the sidewalls of the substrate 102 forming the one or more trenches 112 and sidewalls of the substrate 102 forming the one or more gate recesses 408.

A conductive core 114 is arranged within the one or more trenches 112 and laterally between sidewalls of a dielectric structure 110. A bottom of the conductive core 114 electrically contacts the one or more recessed gate structures 402. In some embodiments, the conductive core 114 and/or the dielectric structure 110 extend through the gate dielectric 406 to physically contact the gate electrode 404 along interfaces that are directly between sidewalls of the substrate 102. In some such embodiments, the gate dielectric 406 is arranged along sidewalls of the dielectric structure 110. In other embodiments (not shown), the conductive core 114 may be separated from the gate electrode 404 by the gate dielectric 406. In such embodiments, the conductive core 114 may be electrically coupled to the one or more recessed gate structures 402 through a channel region that is formed along the gate dielectric 406 (e.g., between source/drain regions disposed within the substrate 102) when a bias voltage is applied to the gate electrode 404.

Figure 5A:
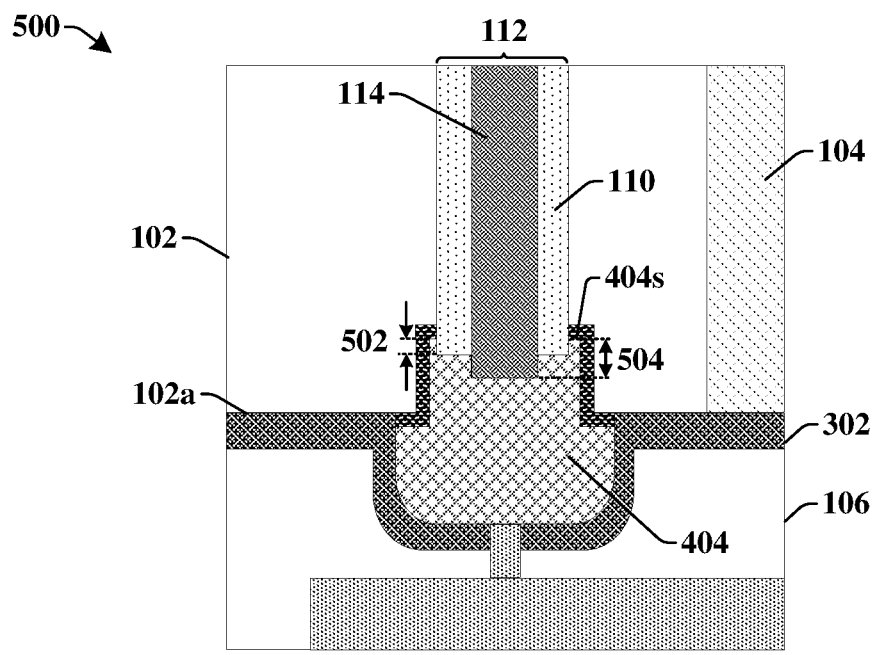
FIGS. 5A-5B illustrate cross-sectional views of some additional embodiments of image sensor ICs having a BTI structure with a conductive core.
Figure 5B:
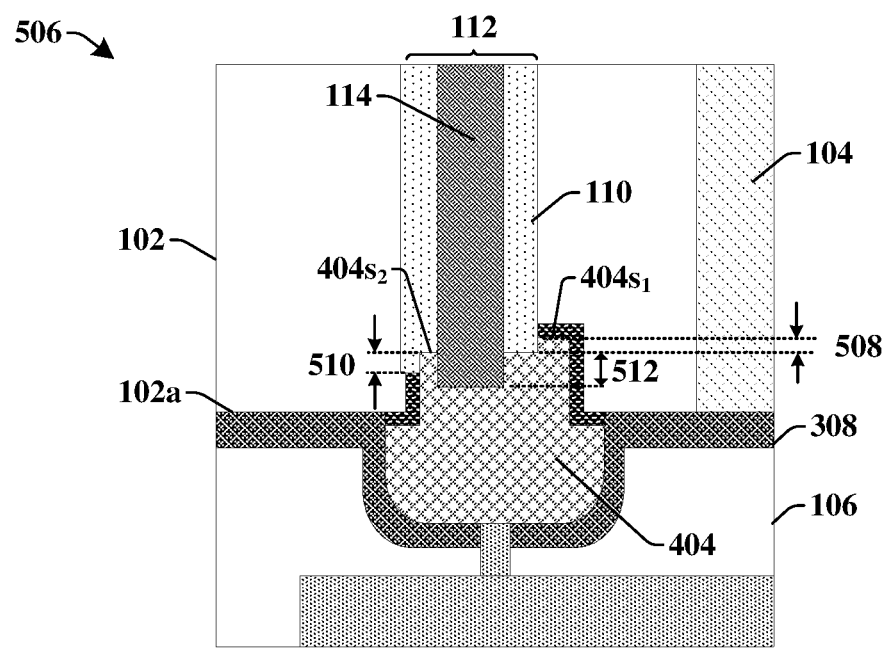

FIGS. 5A-5B illustrate cross-sectional views of some additional embodiments of image sensor ICs having a BTI structure with a conductive core.

As shown in cross-sectional view 500 of FIG. 5A, a recessed gate electrode 404 is arranged along a first side 102a of a substrate 102. The recessed gate electrode 404 extends from along the first side 102a of the substrate 102 to within the substrate 102.

One or more trenches 112 extend through the substrate 102. A dielectric structure 110 and a conductive core 114 are arranged within one or more trenches 112. The dielectric structure 110 extends to a first distance 502 below a surface 404s of the recessed gate electrode 404 that faces the substrate 102. The conductive core 114 extends to a second distance 504 below the surface 404s of the recessed gate electrode 404. In some embodiments, the first distance 502 is less than the second distance 504. In such embodiments, the conductive core 114 extends outward to below a bottom surface of the dielectric structure 110.

As shown in cross-sectional view 506 of FIG. 5B, a recessed gate electrode 404 is arranged along a first side 102a of a substrate 102. The recessed gate electrode 404 extends from along the first side 102a of the substrate 102 to within the substrate 102.

One or more trenches 112 extend through the substrate 102. A dielectric structure 110 and a conductive core 114 are arranged within one or more trenches 112. The dielectric structure 110 extends to a first distance 508 below a first surface $404s_1$ of the recessed gate electrode 404 that faces the substrate 102 and to a second distance 510 below a second surface $404s_2$ of the recessed gate electrode 404 that faces the substrate 102. In some embodiments, the dielectric structure 110 extends along the second surface $404s_2$ and along a sidewall of the recessed gate electrode 404. In such embodiments, opposing sidewalls of the dielectric structure 110 have different lengths. The conductive core 114 extends to a third distance 512 below the second surface $404s_2$ of the recessed gate electrode 404. In some embodiments, the second distance 510 is different than (e.g., smaller than) the third distance 512.

Figure 6A:
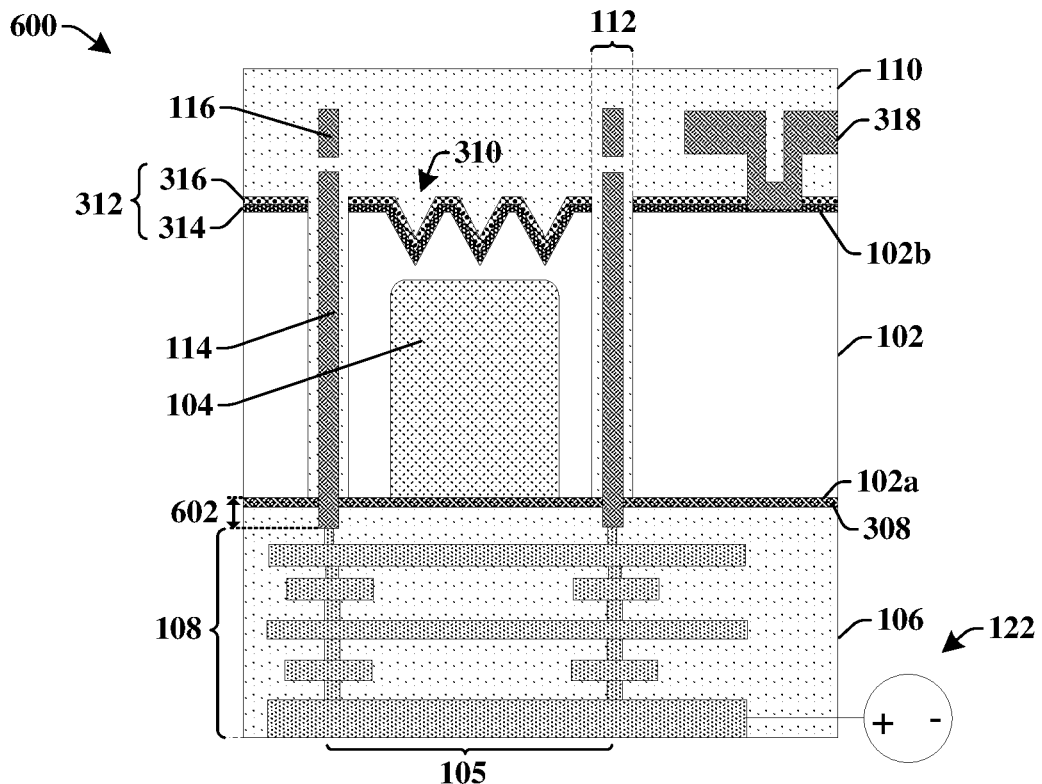
FIGS. 6A-6C illustrate cross-sectional views of some additional embodiments of image sensor ICs having a BTI structure with a conductive core.

FIG. 6A illustrates a cross-sectional view of some additional embodiments of an image sensor IC 600 having a BTI structure with a conductive core.

The image sensor IC 600 comprises a substrate 102 having a first side 102a and a second side 102b. An image sensing element 104 is disposed within a pixel region 105 of the substrate 102. The substrate 102 comprises sidewalls that form one or more trenches 112 along opposing sides of the image sensing element 104. The one or more trenches 112 extend from the second side 102b of the substrate 102 to the first side 102a of the substrate 102.

A dielectric structure 110 and a conductive core 114 are arranged within the one or more trenches 112. The dielectric structure 110 extends to a CESL 308 arranged along the first side 102a of the substrate 102. The conductive core 114 extends through the CESL 308 and a part of the ILD structure 106 to physically contact the one or more interconnects 108. In some embodiments, the conductive core 114 may extend to a distance 602 below the first side 102a of the substrate 102. In various embodiments, the distance 602 may be in a range of between approximately 1000 Å and approximately 6000 Å, between approximately 1500 Å and approximately 5000 Å, between approximately 2000 Å and approximately 4000 Å, or other similar values.

Figure 6B:
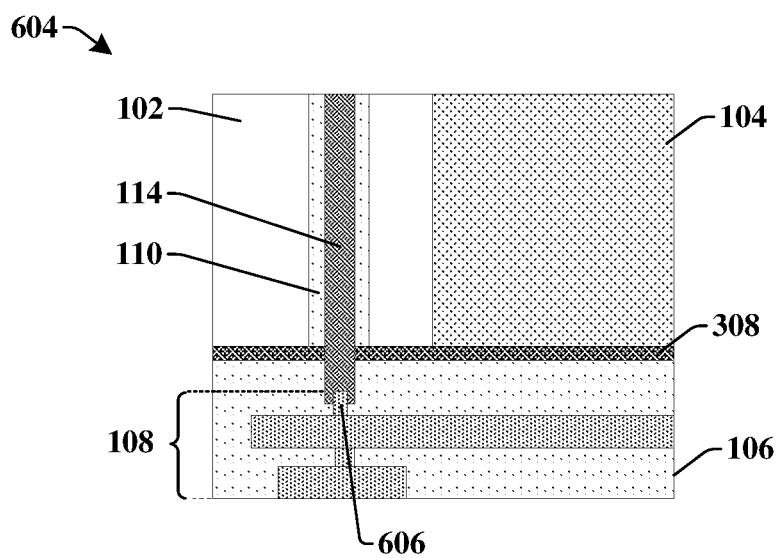
Figure 6C:
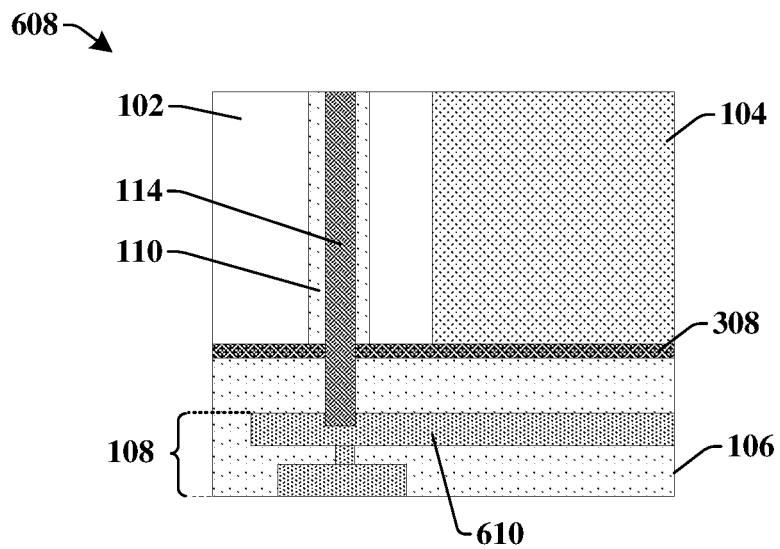

FIGS. 6B-6C illustrate cross-sectional views, 604 and 608, of some additional embodiments of an image sensor IC having a BTI structure with a conductive core.

As shown in cross-sectional view 604 of FIG. 6B, the conductive core 114 extends through the CESL 308 and a part of the ILD structure 106 to physically contact an interconnect via 606. In some embodiments, the conductive core 114 may wrap around one or more sidewalls of the interconnect via 606.

As shown in cross-sectional view 608 of FIG. 6C, the conductive core 114 extends through the CESL 308 and a part of the ILD structure 106 to physically contact an interconnect wire 610. In some embodiments, the interconnect wire 610 may be disposed on an interconnect wire layer that is a closest interconnect wire layer (e.g., an "M1" layer) to the substrate 102. In some embodiments, the interconnect wire 610 may wrap around one or more sidewalls of the conductive core 114

Figure 7:
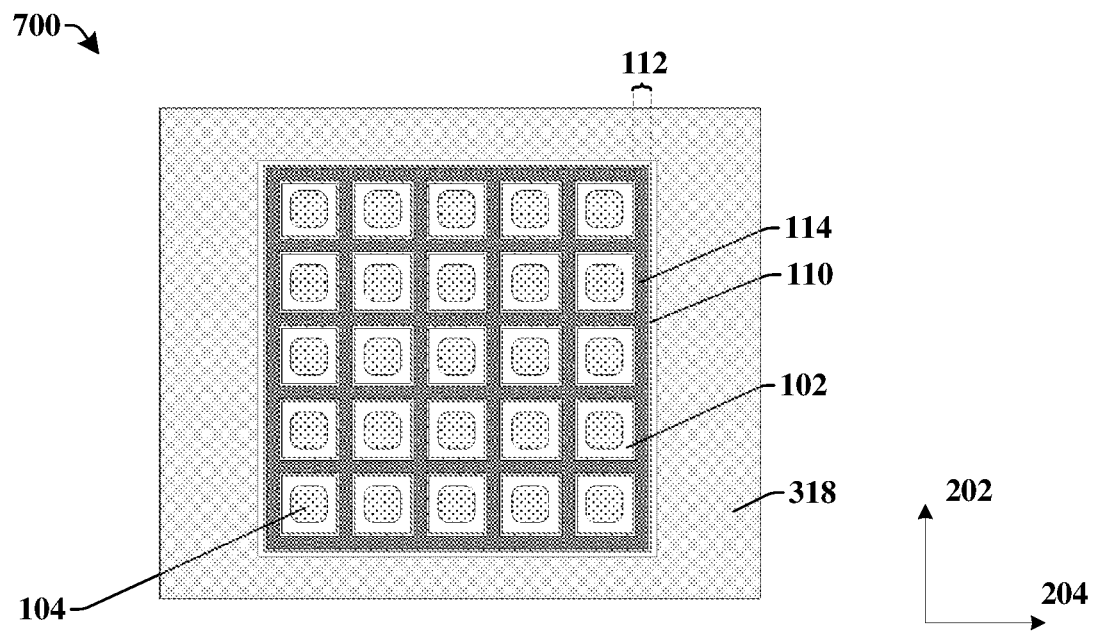
FIG. 7 illustrates a top-view of some embodiments of an image sensor IC having an array of image sensing elements surrounded by one or more BTI structures with a conductive core.

FIG. 7 illustrates a top-view of some embodiments of an image sensor IC 700 having an array of image sensing elements surrounded by one or more BTI structures with a conductive core.

The image sensor IC 700 comprises a plurality of image sensing elements 104 arranged in an array in rows and columns. The columns extend in a first direction 202 and the rows extend in a second direction 204. One or more trenches 112 extend around the plurality of image sensing elements 104. The one or more trenches 112 may comprise a single trench that continuously extends around the plurality of image sensing elements 104. In such embodiments, the single trench comprises segments that extend in the first direction 202 and the second direction 204. A dielectric structure 110 is arranged within the one or more trenches 112 and a conductive core 114 is arranged within the one or more trenches 112 between sidewalls of the dielectric structure 110. In some embodiments, the dielectric structure 110 and the conductive core 114 may both continuously extend around the plurality of image sensing elements 104. A conductive shield 318 extends around the array. The conductive shield is shown in FIG. 7 in phantom.

Figure 8B:
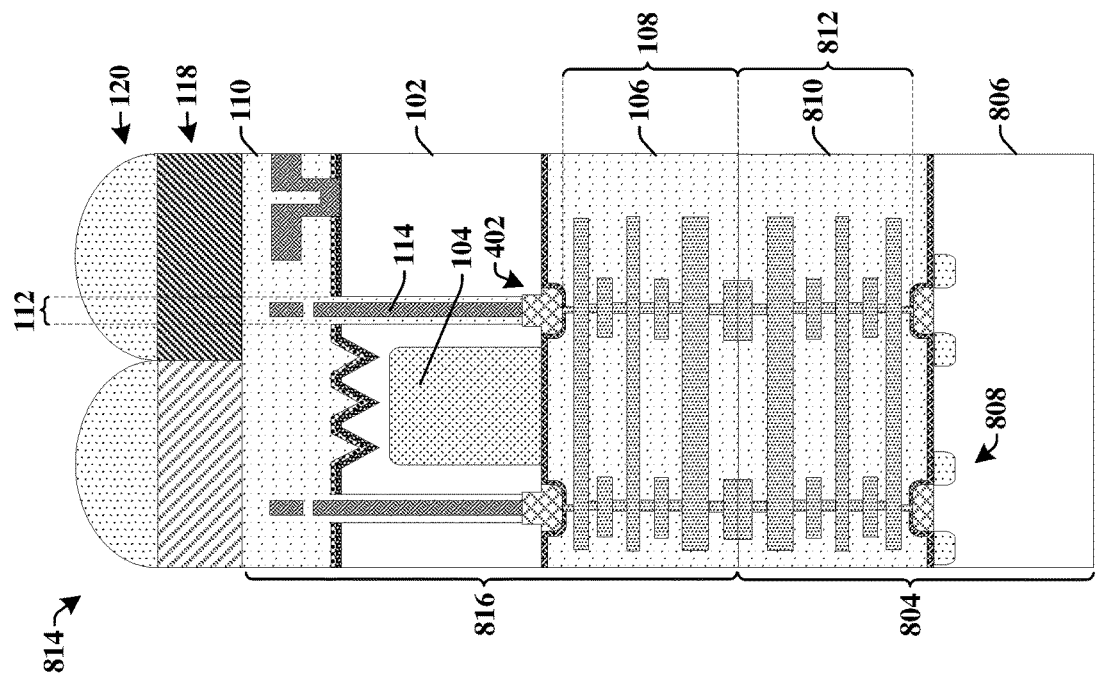
FIGS. 8A-8C illustrate cross-sectional views of some embodiments of multi-dimensional integrated chips comprising an image sensor IC having a BTI structure with a conductive core.
Figure 8A:
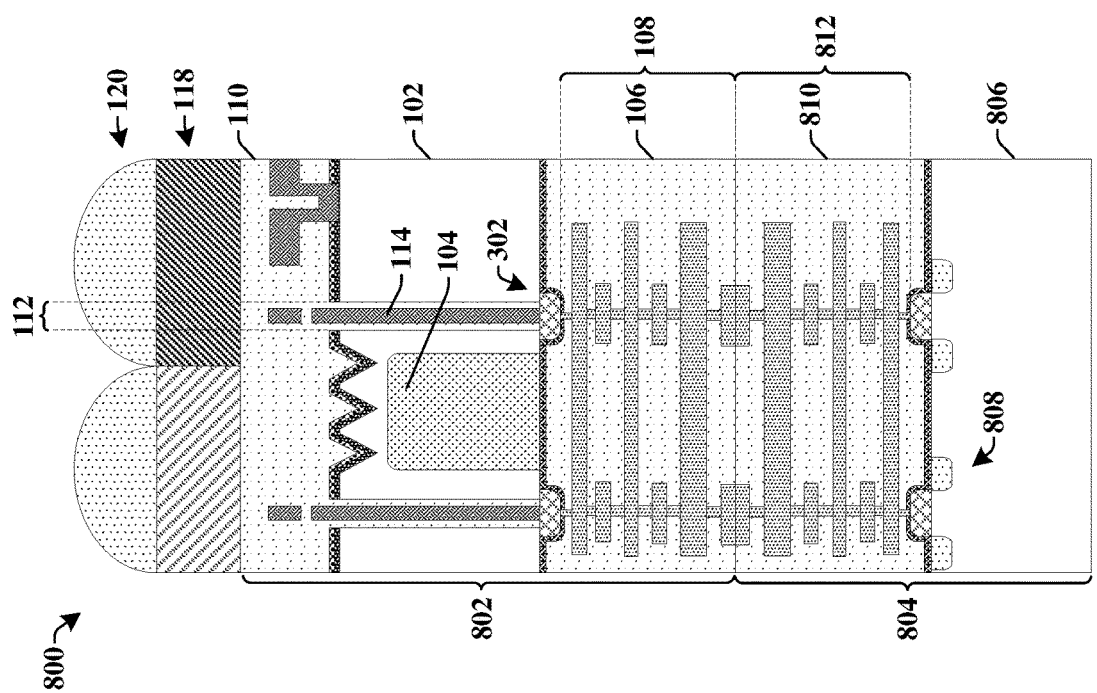
Figure 8C:
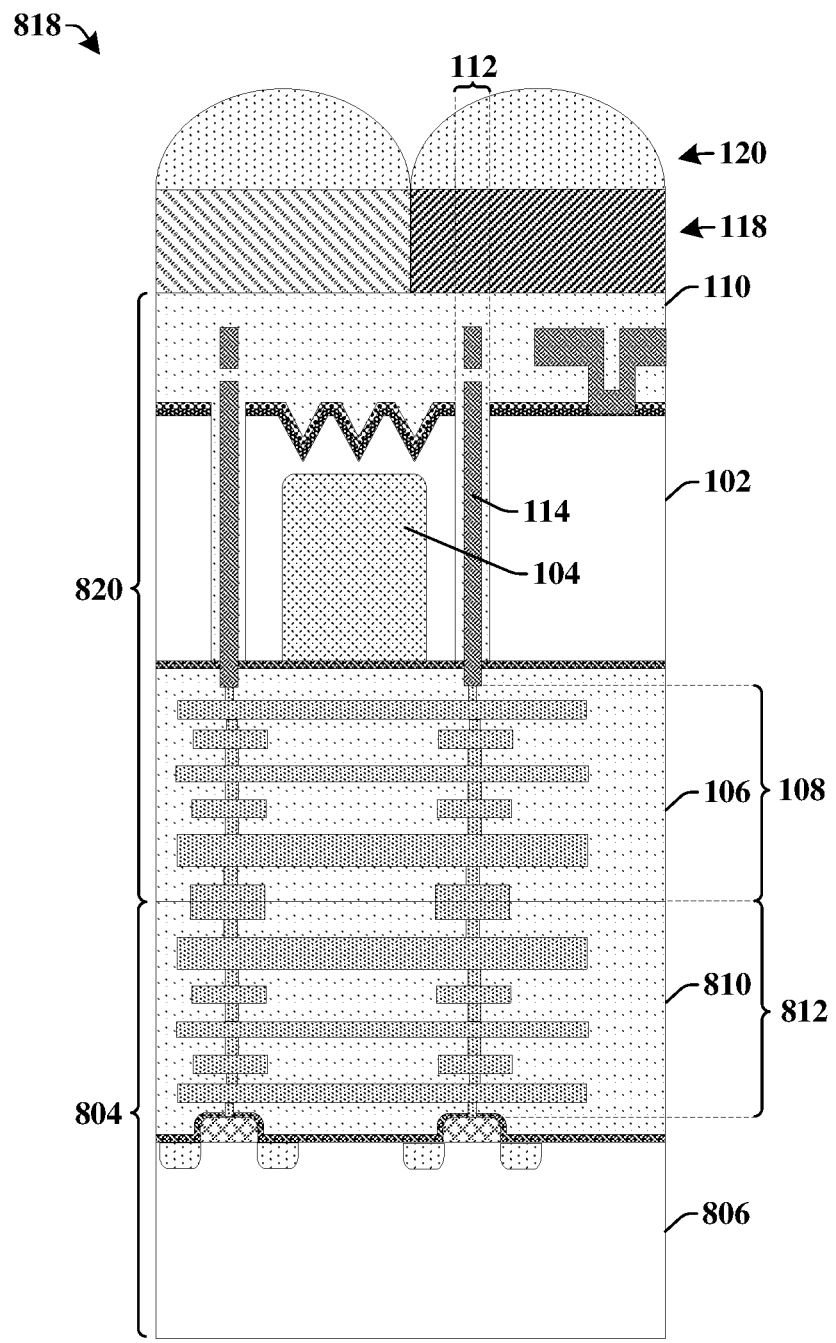

FIGS. 8A-8C illustrate cross-sectional views of some embodiments of multi-dimensional integrated chips comprising an image sensor IC having a BTI structure with a conductive core.

FIG. 8A illustrates a multi-dimensional integrated chip structure 800 comprising a first integrated chip (IC) die 802 stacked onto a second IC die 804.

The first integrated chip die 802 comprises an image sensing element 104 disposed within a substrate 102. One or more interconnects 108 are arranged within an ILD structure 106 on the substrate 102. In some embodiments, the one or more interconnects 108 comprise a bond pad arranged along a bottom surface of the ILD structure 106 that faces away from the substrate 102. One or more trenches 112 extend into the substrate 102 on opposing sides of the image sensing element 104. A dielectric structure 110 is arranged on sidewalls of the substrate 102 forming the one or more trenches 112. A conductive core 114 is arranged on sidewalls of the dielectric structure 110 and within the one or more trenches 112. The conductive core 114 extends to one or more gate structures 302 arranged on a first side of the substrate 102 directly below the one or more trenches 112.

The second IC die 804 comprises one or more semiconductor devices 808 disposed within a second substrate 806. In some embodiments, the one or more semiconductor devices 808 may comprise a transistor device (e.g., a planar FET, a FinFET, a gate-all-around (GAA) device, etc.). In some embodiments, the one or more semiconductor devices 808 may be part of a biasing source (e.g., 122 of FIG. 1) configured to apply a bias voltage to the conductive core 114. One or more second interconnects 812 are arranged within a second ILD structure 810 on the second substrate 806. The one or more second interconnects 812 may comprise a second bond pad arranged on a top surface of the second ILD structure 810 that faces away from the second substrate 806. The ILD structure 106 is bonded to the second ILD structure 810 along a hybrid bonding interface, in which the one or more interconnects 108 contact the one or more second interconnects 812 along a conductive interface and the ILD structure 106 contacts the second ILD structure 810 along a dielectric interface.

FIG. 8B illustrates a multi-dimensional integrated chip structure 814 comprising a first IC die 816 stacked onto a second IC die 804.

The first IC die 816 comprises an image sensing element 104 disposed within a substrate 102. One or more interconnects 108 are arranged within an ILD structure 106 on the substrate 102. One or more trenches 112 extend into the substrate 102 on opposing sides of the image sensing element 104. A dielectric structure 110 is arranged on sidewalls of the substrate 102 forming the one or more trenches 112. A conductive core 114 is arranged on sidewalls of the dielectric structure 110 and within the one or more trenches 112. The conductive core 114 extends to one or more recessed gate structures 402 arranged on a first side of the substrate 102 and within the substrate 102.

The second IC die 804 comprises one or more semiconductor devices 808 disposed within a second substrate 806. One or more second interconnects 812 are arranged within a second ILD structure 810 on the second substrate 806. The first IC die 816 is bonded to the second IC die 804 along a metal-to-metal and a dielectric-to-dielectric interface (e.g., along an interface having one or more regions where a metal of the first IC die 816 is bonded to a metal of the second IC die 804 and one or more regions where a dielectric of the first IC die 816 is bonded to a dielectric of the second IC die 804).

FIG. 8C illustrates a multi-dimensional integrated chip structure 818 comprising a first IC die 820 stacked onto a second IC die 804.

The first IC die 820 comprises an image sensing element 104 disposed within a substrate 102. One or more interconnects 108 are arranged within an ILD structure 106 on the substrate 102. One or more trenches 112 extend into the substrate 102 on opposing sides of the image sensing element 104. A dielectric structure 110 is arranged on sidewalls of the substrate 102 forming the one or more trenches 112. A conductive core 114 is arranged on sidewalls of the dielectric structure 110 and within the one or more trenches 112. The conductive core 114 extends to the one or more interconnects 108.

The second IC die 804 comprises one or more semiconductor devices 808 disposed within a second substrate 806. One or more second interconnects 812 are arranged within a second ILD structure 810 on the second substrate 806. The ILD structure 106 is bonded to the second ILD structure 810 along a hybrid bonding interface.

FIGS. 9-20 illustrate some embodiments of a method of forming a multi-dimensional integrated chip comprising an image sensor IC having a BTI structure with a conductive core. Although FIGS. 9-20 are described in relation to a method, it will be appreciated that the structures disclosed in FIGS. 9-20 are not limited to such a method, but instead may stand alone as structures independent of the method.

Figure 9:
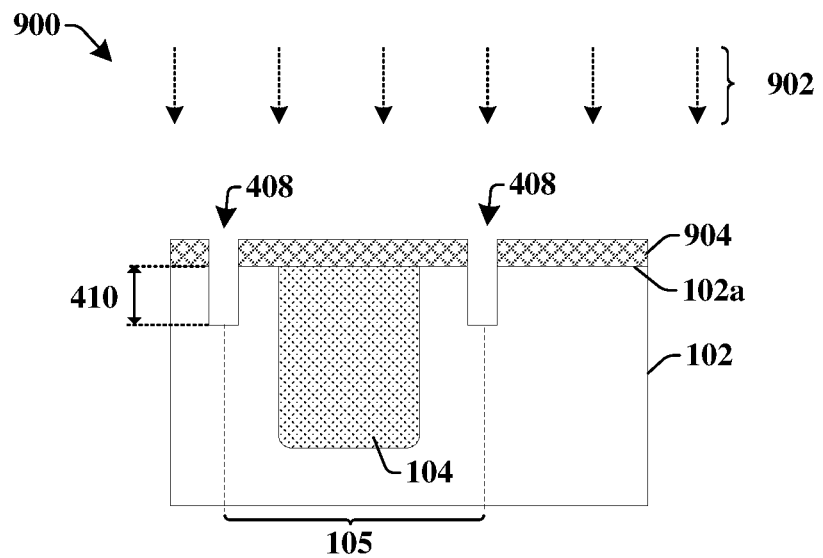
FIGS. 9-20 illustrate some embodiments of a method of forming a multi-dimensional integrated chip comprising an image sensor IC having a BTI structure with a conductive core.

As shown in cross-sectional view 900 of FIG. 9, a substrate 102 is provided. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith.

An image sensing element 104 is formed within a pixel region 105 of the substrate 102. In some embodiments, the image sensing element 104 may comprise a photodiode formed by implanting one or more dopant species into a first side 102a of the substrate 102. For example, the image sensing element 104 may be formed by selectively performing a first implantation process (e.g., according to a masking layer) to form a first region having a first doping type (e.g., n-type), and subsequently performing a second implantation process to form a second region abutting the first region and having a second doping type (e.g., p-type) different than the first doping type. In some embodiments a floating diffusion well (not shown) may also be formed using one of the first or second implantation processes.

One or more gate recesses 408 are formed within the first side 102a of the substrate 102. The one or more gate recesses 408 are formed along opposing sides of the pixel region 105 and extend to a first distance 410 (e.g., a first depth) into the substrate 102. In some embodiments, the one or more gate recesses 408 may be formed by a first etching process that selectively exposes the substrate 102 to a first etchant 902 according to a first mask 904. In various embodiments, the first etchant 902 may comprise a dry etchant (e.g., an ion beam etchant, a RIE etchant, or the like) or a wet etchant.

Figure 10:
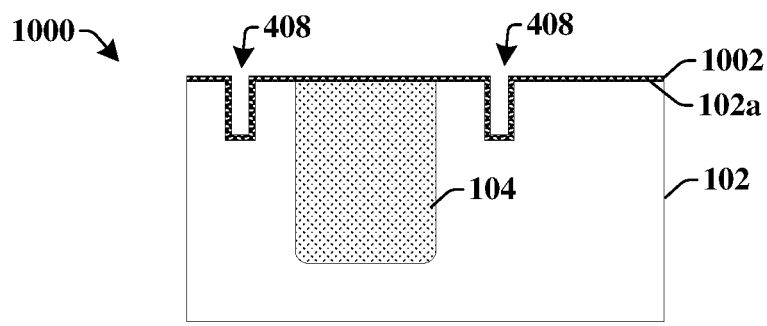

As shown in cross-sectional view 1000 of FIG. 10, a gate dielectric layer 1002 is formed on the substrate 102. The gate dielectric layer 1002 covers the first side 102a of the substrate 102 and extends to within the one or more gate recesses 408. In some embodiments, the gate dielectric layer 1002 is conformally formed along sidewalls and a horizontally extending surface of the substrate 102 that forms the one or more gate recesses 408. In some embodiments, the gate dielectric layer 1002 may be deposited by a deposition process (e.g., a physical vapor deposition (PVD) process, a chemical vapor deposition (CVD) process, a plasma enhanced CVD (PE-CVD) process, an atomic layer deposition (ALD) process, a sputter deposition process, or the like).

Figure 11:
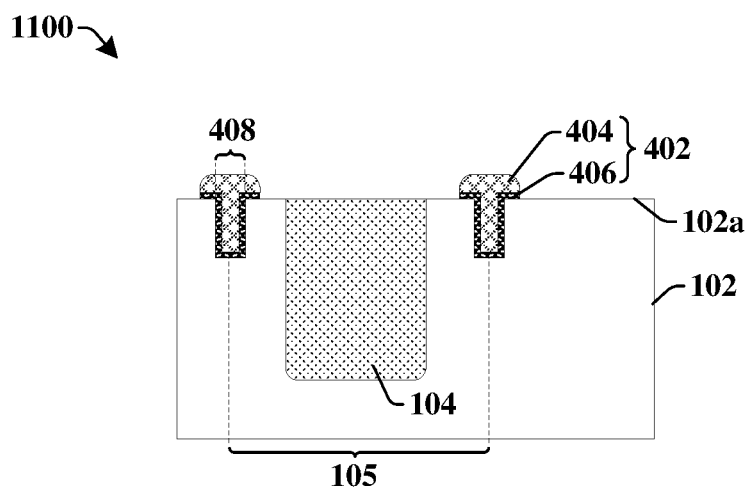

As shown in cross-sectional view 1100 of FIG. 11, one or more gate electrodes 404 are formed over the substrate 102 and within the one or more gate recesses 408. In some embodiments, the one or more gate electrodes 404 are formed by depositing a gate electrode layer onto the gate dielectric layer (e.g., 1002 of FIG. 10) followed by a patterning process that selectively etches the gate electrode layer and the gate dielectric layer. The patterning process forms the one or more recessed gate structures 402 respectively having a gate electrode 404 over a gate dielectric 406.

Figure 12:
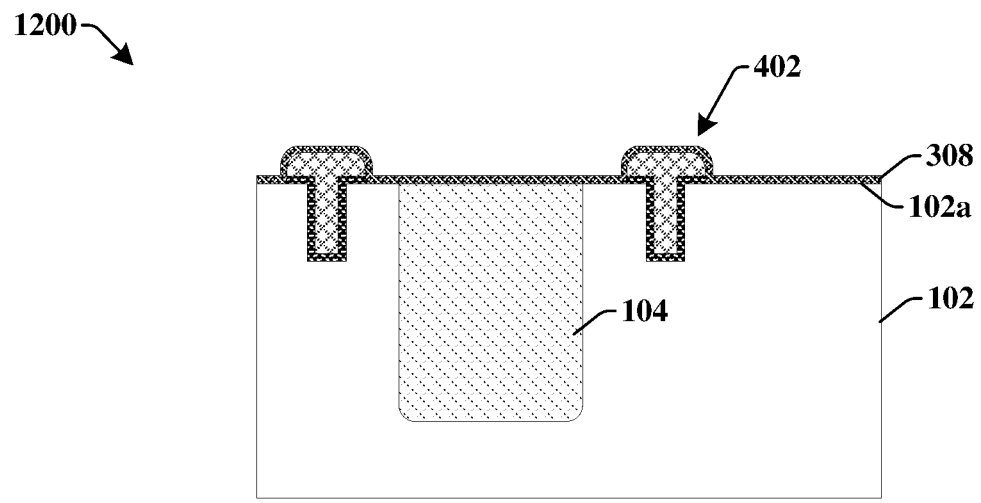

As shown in cross-sectional view 1200 of FIG. 12, a contact etch stop layer (CESL) 308 is formed onto the first side 102a of the substrate 102 and over the one or more recessed gate structures 402. In some embodiments, the CESL 308 may comprise a nitride (e.g., silicon nitride, silicon oxynitride, etc.), a carbide (e.g., silicon carbide, silicon oxycarbide, etc.), or the like. In some embodiments, the CESL 308 may be deposited by a deposition process (e.g., a PVD process, a CVD process, a PE-CVD process, an ALD process, a sputtering deposition process, or the like).

Figure 13:
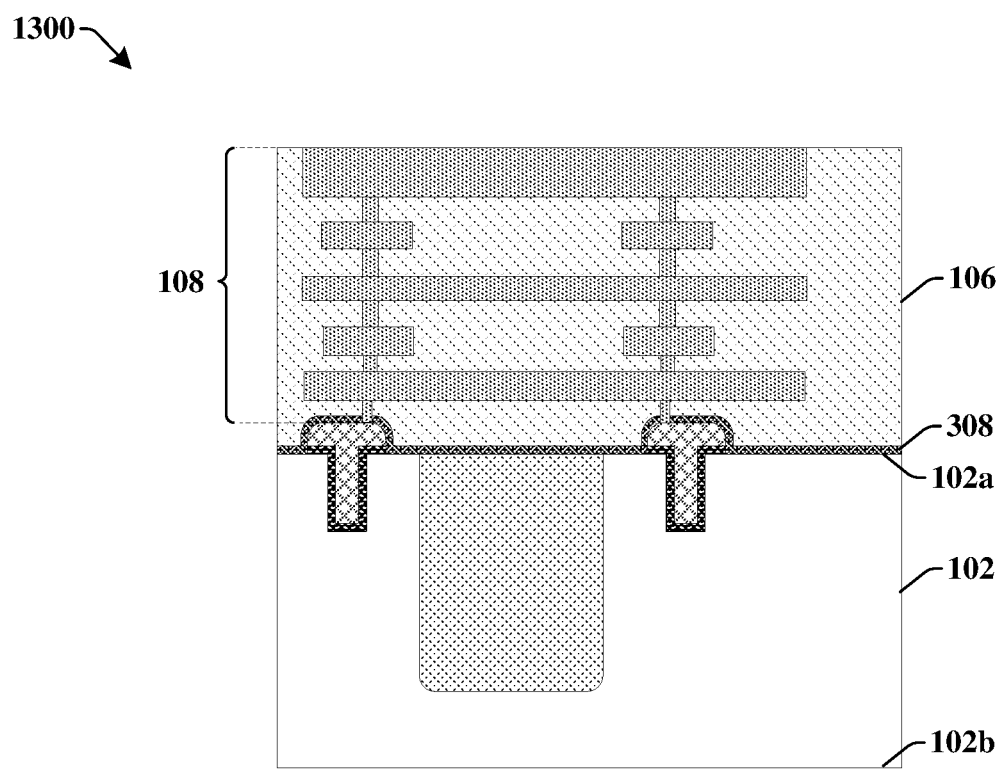

As shown in cross-sectional view 1300 of FIG. 13, one or more interconnects 108 are formed within an ILD structure 106 formed along the first side 102a of the substrate 102. The ILD structure 106 comprises a plurality of stacked ILD layers, while the one or more interconnects 108 comprise alternating layers of conductive wires and vias. In some embodiments, one or more of the one or more interconnects 108 may be formed using a damascene process (e.g., a single damascene process or a dual damascene process). The damascene process is performed by forming an ILD layer over the first side 102a of the substrate 102, etching the ILD layer to form a via hole and/or a trench, and filling the via hole and/or trench with a conductive material. In some embodiments, the ILD layer may be deposited by a physical vapor deposition technique (e.g., PVD, CVD, PE-CVD, ALD, etc.) and the conductive material may be formed using a deposition process and/or a plating process (e.g., electroplating, electro-less plating, etc.). In various embodiments, the conductive material may comprise tungsten, copper, aluminum, copper, or the like.

In some embodiments (not shown), the ILD structure 106 may be bonded to a support substrate (not shown)(e.g., a handle substrate). In some embodiments, the support substrate may comprise a semiconductor material, such as silicon, for example. After bonding the ILD structure 106 to the support substrate, the substrate 102 may be thinned to reduce a thickness of the substrate 102 from a first thickness to a second thickness that is less than the first thickness. Thinning the substrate 102 allows for radiation to pass more easily to the image sensing element 104. In various embodiments, the substrate 102 may be thinned by etching and/or mechanical grinding a second side 102b of the substrate 102.

Figure 14:
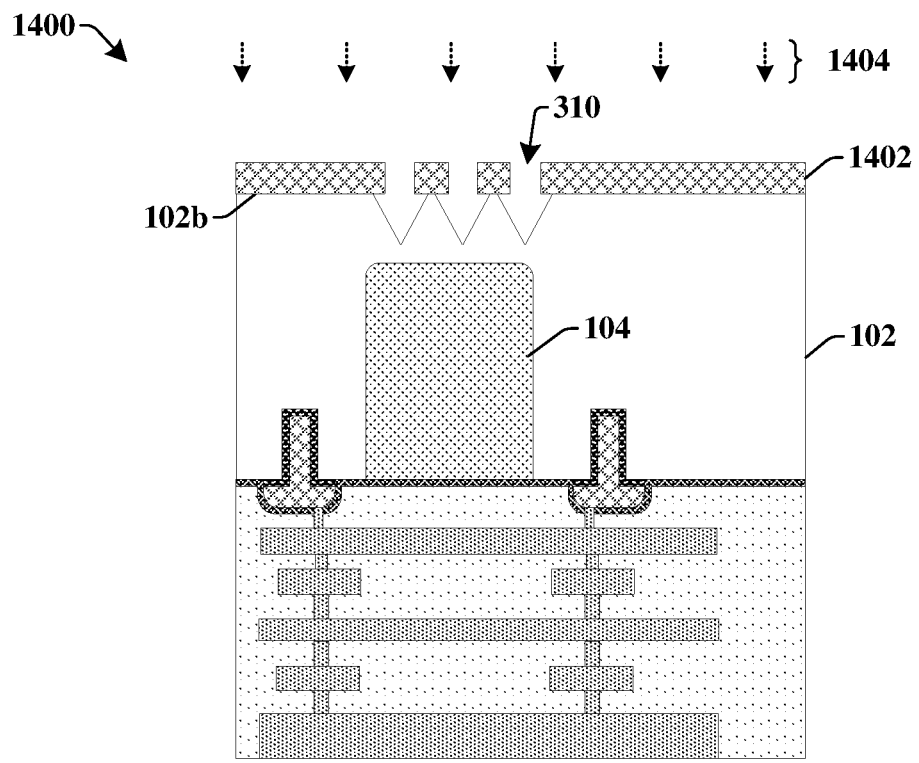

As shown in cross-sectional view 1400 of FIG. 14, a second mask 1402 is formed along the second side 102b (e.g., the back-side) of the substrate 102. The second mask 1402 comprises sidewalls defining openings along the second side 102b of the substrate 102. In some embodiments, the second mask 1402 may be formed by depositing a layer of photosensitive material (e.g., a positive or negative photoresist) along the second side 102b of the substrate 102. The layer of photosensitive material is selectively exposed to electromagnetic radiation according to a photomask. The electromagnetic radiation modifies a solubility of exposed regions within the photosensitive material to define soluble regions. The photosensitive material is subsequently developed to define the openings within the photosensitive material by removing the soluble regions.

A second patterning process is performed on the second side 102b of the substrate 102 according to the second mask 1402. The second patterning process is performed by exposing the substrate 102 to one or more second etchants 1404 with the second mask 1402 2 in place. The one or more second etchants 1404 remove parts of the substrate 102 to form a plurality of recesses 310 within the second side 102b of the substrate 102. The plurality of recesses 310 are formed directly over the image sensing element 104. In some embodiments, the second etching process may comprise a dry etching process. For example, the second patterning process may comprise a coupled plasma etching process, such as an inductively coupled plasma (ICP) etching process or a capacitively coupled plasma (CCP) etching process. In other embodiments, the second patterning process may comprise a wet etching process.

Figure 15:
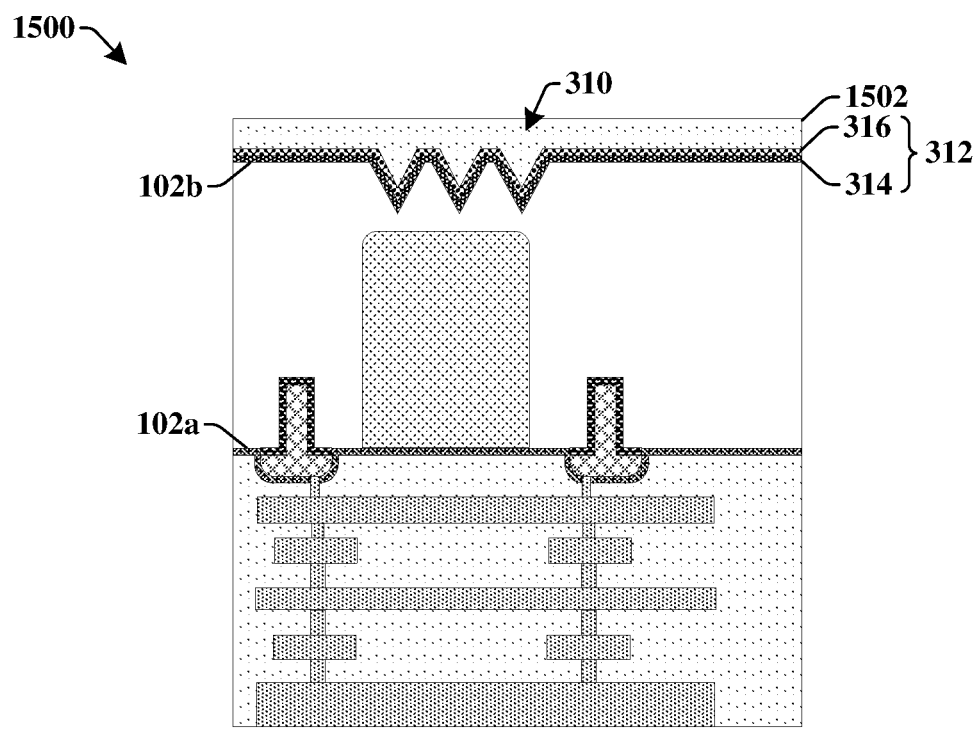

As shown in cross-sectional view 1500 of FIG. 15, one or more absorption enhancement layers 312 are formed along the second side 102b of the substrate 102. In some embodiments, the one or more absorption enhancement layers 312 may comprise a first absorption enhancement layer 314 formed along the second side 102b of the substrate 102. The first absorption enhancement layer 314 lines the second side 102b of the substrate 102. In some embodiments, the first absorption enhancement layer 314 may comprise a high-k dielectric layer including hafnium oxide ($HfO_2$), titanium oxide ($TiO_2$), hafnium zirconium oxide (HfZrO), tantalum oxide ($Ta_2O_3$), hafnium silicon oxide ($HfSiO_4$), zirconium oxide ($ZrO_2$), zirconium silicon oxide ($ZrSiO_2$), etc. In some embodiments, the first absorption enhancement layer 314 may be deposited by a physical vapor deposition technique (e.g., PVD, CVD, PE-CVD, ALD, etc.). In some embodiments, the one or more absorption enhancement layers 312 may further comprise second absorption enhancement layer 316 formed over the first absorption enhancement layer 314. In various embodiments, the second absorption enhancement layer 316 may comprise an oxide (e.g., silicon oxide), TEOS, etc.

A first dielectric layer 1502 is formed over the one or more absorption enhancement layers 312. In some embodiments, the first dielectric layer 1502 may fill the plurality of recesses 310. In some embodiments, a planarization process may be performed onto the first dielectric layer 1502. In various embodiments, the planarization process may comprise a chemical mechanical planarization (CMP) process, an etching process, a mechanical grinding process, or the like.

Figure 16:
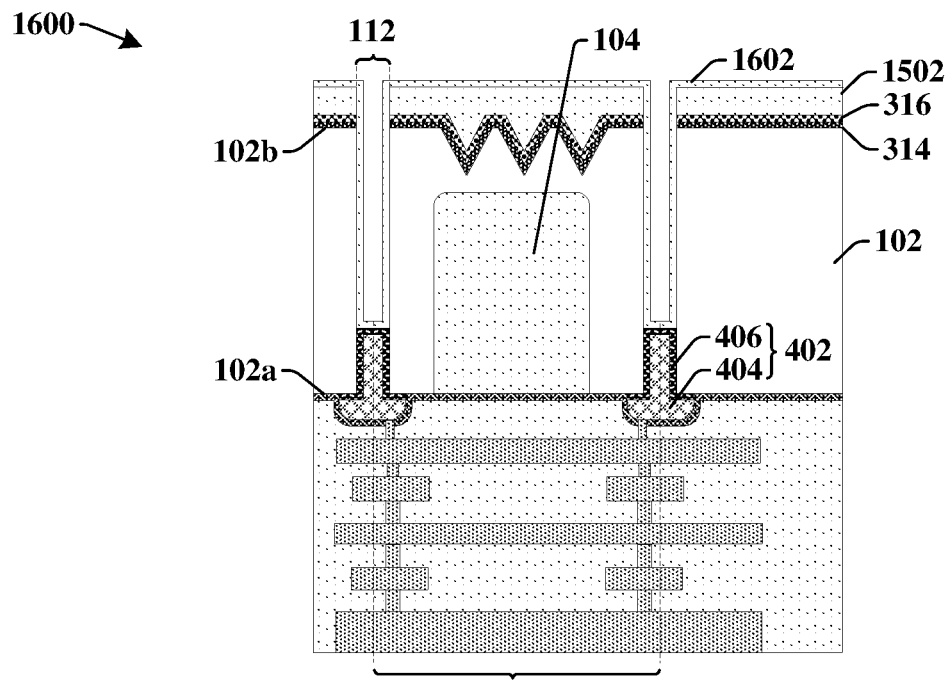

As shown in cross-sectional view 1600 of FIG. 16, one or more trenches 112 are formed within the second side 102b of the substrate 102. The one or more trenches 112 vertically extend from the second side 102b of the substrate 102 to within the substrate 102 on opposing sides of the image sensing element 104 and along opposing sides of the pixel region 105. In some embodiments, the one or more trenches 112 are formed directly over the one or more recessed gate structures 402. In some embodiments, the one or more trenches 112 expose parts of the one or more recessed gate structures 402 along opposing sides of the pixel region 105. For example, in some embodiments the one or more trenches 112 may expose a part of the gate dielectric 406, while in some embodiments (not shown) the one or more trenches 112 may extend through the gate dielectric 406 to expose a part of the gate electrode 404.

In some embodiments, the one or more trenches 112 may be formed by a third patterning process that selectively etches the second side 102b of the substrate 102. In some embodiments, the second side 102b of the substrate 102 may be selectively etched by exposing the second side 102b of the substrate 102 to one or more third etchants according to a third mask (e.g., a photoresist, a hard mask, or the like). In some embodiments, the one or more third etchants may comprise a dry etchant. In some embodiments, the dry etchant may have an etching chemistry comprising one or more of oxygen ($O_2$), nitrogen ($N_2$), hydrogen ($H_2$), argon (Ar), and/or a fluorine species (e.g., $CF_4$, $CHF_3$, $C_4F_8$, etc.).

A second dielectric layer 1602 is formed on the second side 102b of the substrate 102 and within the one or more trenches 112. The second dielectric layer 1602 may be formed to conformally line sidewalls of the substrate 102 and horizontally extending surfaces of the first dielectric layer 1502 and the gate dielectric 406. In some embodiments, the second dielectric layer 1602 may comprise an oxide (e.g., silicon oxide), a nitride (e.g., silicon nitride, silicon oxynitride, etc.), or the like. In various embodiments, the second dielectric layer 1602 may be deposited by a deposition process (e.g., a PVD process, a CVD process, a PE-CVD process, an ALD process, a sputter deposition process, or the like).

Figure 17:
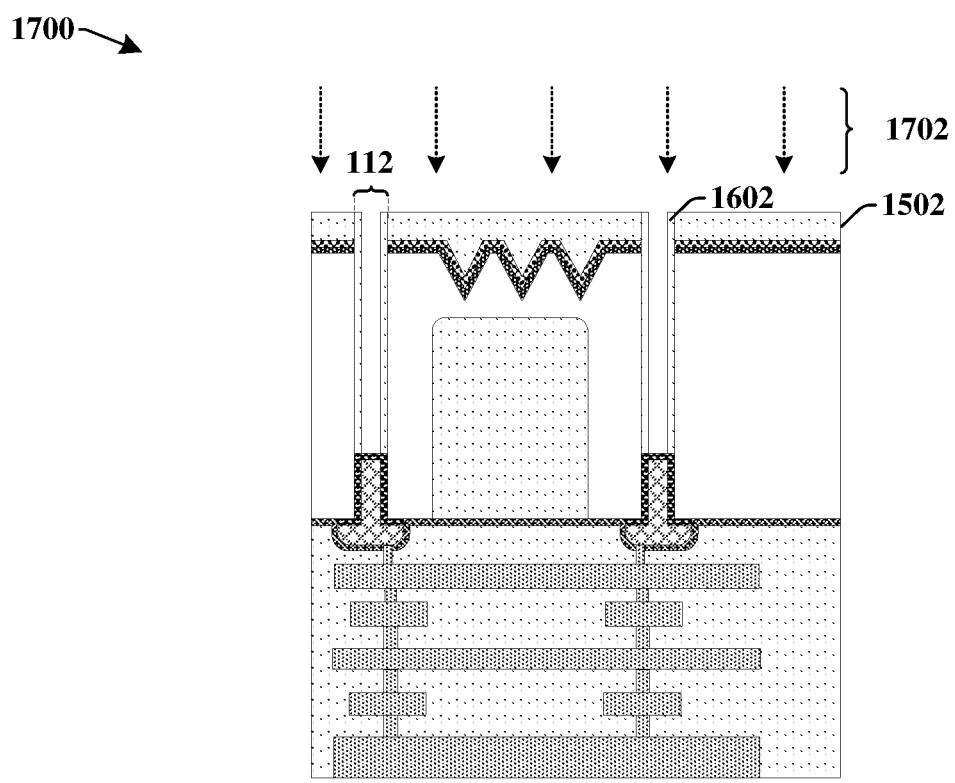

As shown in cross-sectional view 1700 of FIG. 17, the second dielectric layer 1602 is exposed to one or more fourth etchants 1702 (e.g., a dry etchant), which remove a part of the second dielectric layer 1602 from horizontal surfaces. Removing the part of the second dielectric layer 1602 from horizontal surfaces leaves a part of the second dielectric layer 1602 along sidewalls of the substrate 102 that form the one or more trenches 112.

Figure 18:
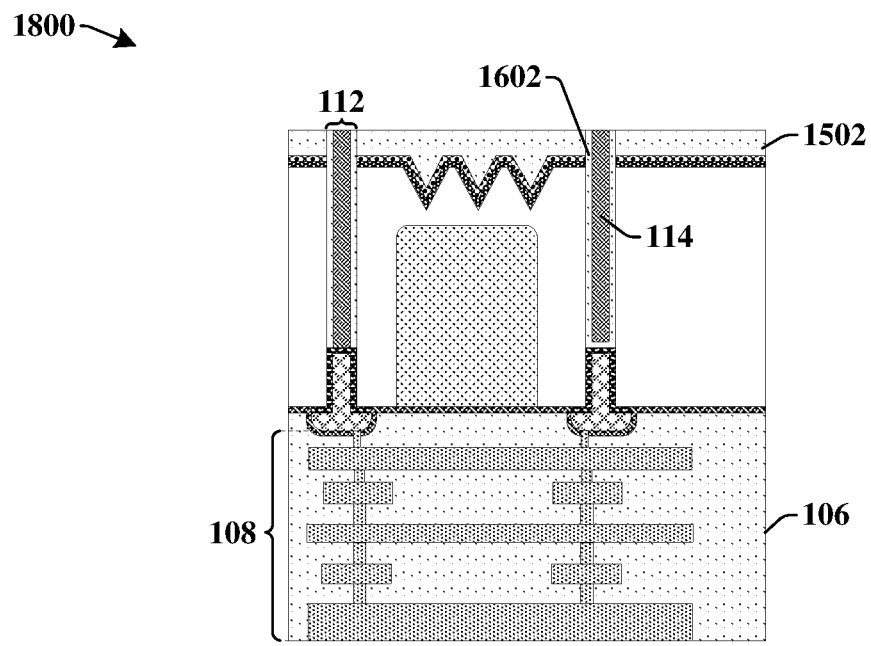

As shown in cross-sectional view 1800 of FIG. 18, a conductive core 114 is formed within the one or more trenches 112 between sidewalls of the second dielectric layer 1602. The conductive core 114 is formed to be electrically coupled to the one or more interconnects 108 within the ILD structure 106. In some embodiments, the conductive core 114 may be formed by forming a conductive material within the one or more trenches 112. A planarization process (e.g., a chemical mechanical planarization process) is subsequently performed to remove a part of the conductive material from over the first dielectric layer 1502 and the second dielectric layer 1602. In some embodiments, the conductive material may be formed by way of a deposition process (e.g., a PVD process, a CVD process, a PE-CVD process, an ALD process, a sputter deposition process, or the like) and/or a plating process (e.g., electroplating, electroless plating, etc.). In various embodiments, the conductive material may comprise tungsten, aluminum, or the like.

Figure 19:
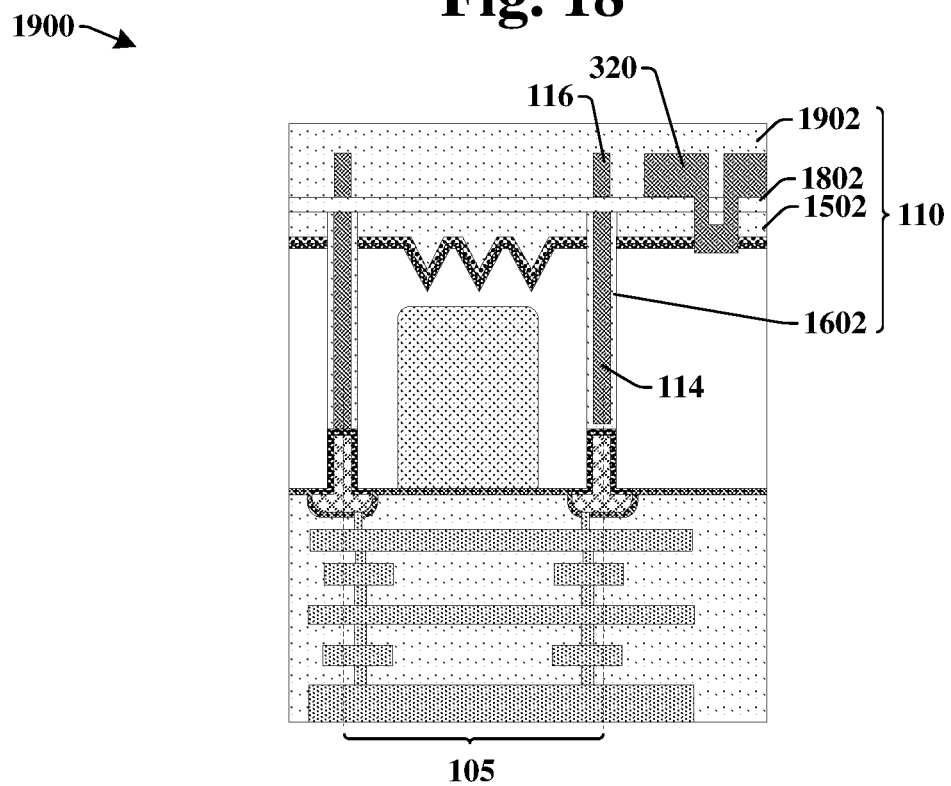

As shown in cross-sectional view 1900 of FIG. 19, a third dielectric layer 1802 is formed onto the first dielectric layer 1502, the second dielectric layer 1602, and the conductive core 114. A grid structure 116 is formed on the third dielectric layer 1802. The grid structure 116 may comprise a metal that is formed directly over the conductive core 114. In some embodiments, the grid structure 116 may be formed by a deposition process and/or a plating process followed by an etching process. In some embodiments, a conductive shield 318 may be formed on the third dielectric layer 1802 outside of the pixel region. In some embodiments, the conductive shield 318 may be formed concurrent to the grid structure 116.

A fourth dielectric layer 1902 is formed over the grid structure 116 and/or the conductive shield 318. In some embodiments, the fourth dielectric layer 1902 may be formed by way of a deposition process (e.g., a PVD process, a CVD process, a PE-CVD process, an ALD process, a sputter deposition process, or the like). In various embodiments, the fourth dielectric layer 1902 may comprise an oxide, a nitride, or the like.

Figure 20:
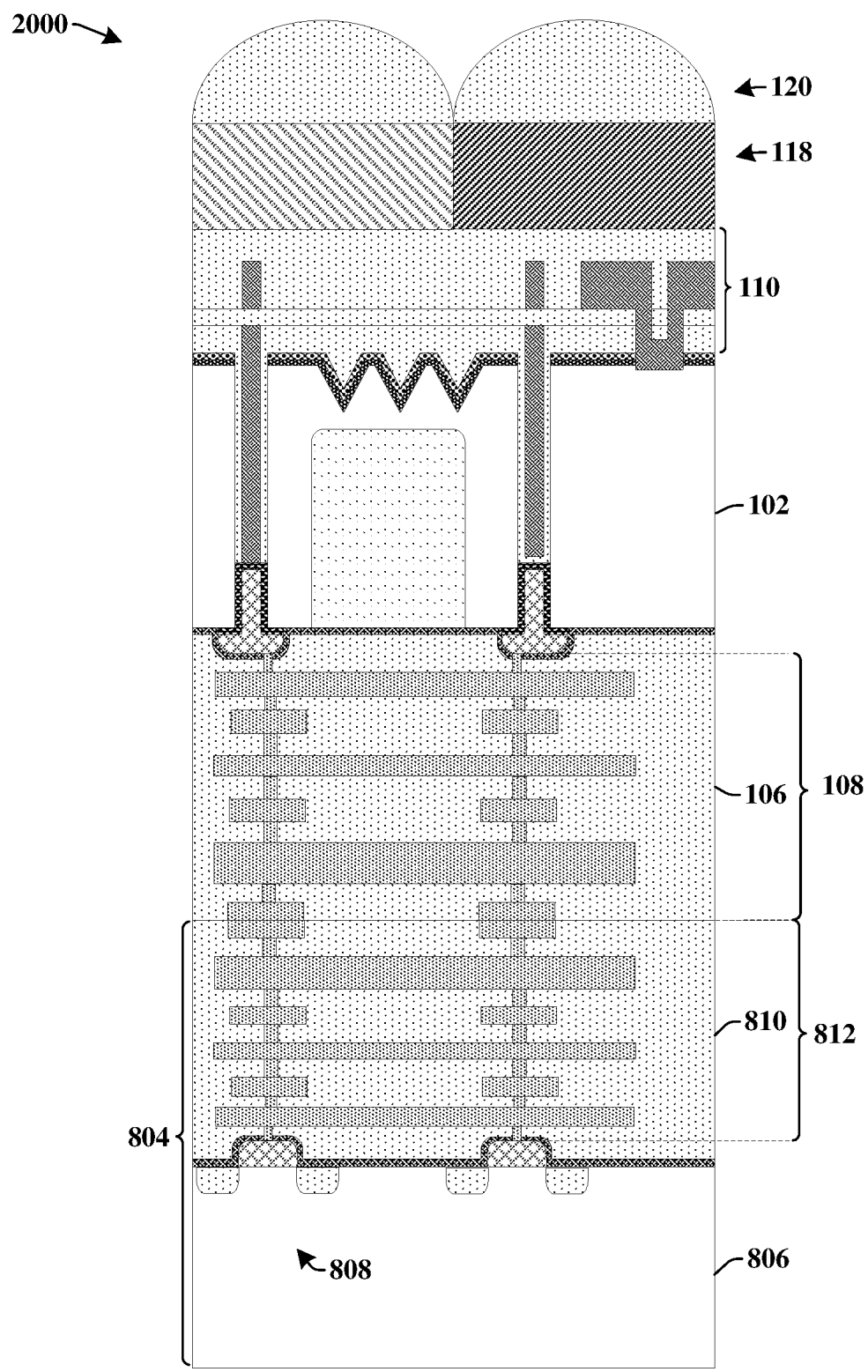

As shown in cross-sectional view 2000 of FIG. 20, the ILD structure 106 is bonded to a second IC die 804. The second IC die 804 comprises one or more semiconductor device 808 disposed within a second substrate 806. In various embodiments, the one or more semiconductor devices 808 may comprise a transistor device (e.g., a planar FET, a FinFET, a gate-all-around (GAA) device, etc.). In some embodiments, the one or more semiconductor devices 808 may be part of a biasing source. One or more second interconnects 812 are arranged within a second ILD structure 810 on the second substrate 806. The ILD structure 106 is bonded to the second ILD structure 810 along a hybrid bonding interface, in which the one or more interconnects 108 contact the one or more second interconnects 812 along a conductive interface and the ILD structure 106 contacts the second ILD structure 810 along a dielectric interface. After bonding the ILD structure 106 to the second IC die 804, a color filter 118 may be formed onto the dielectric structure 110, and a micro-lens 120 may subsequently be formed onto the color filter 118.

FIGS. 21-30 illustrate some additional embodiments of a method of forming a multi-dimensional integrated chip comprising an image sensor IC having a BTI structure with a conductive core. Although FIGS. 21-30 are described in relation to a method, it will be appreciated that the structures disclosed in FIGS. 21-30 are not limited to such a method, but instead may stand alone as structures independent of the method.

Figure 21:
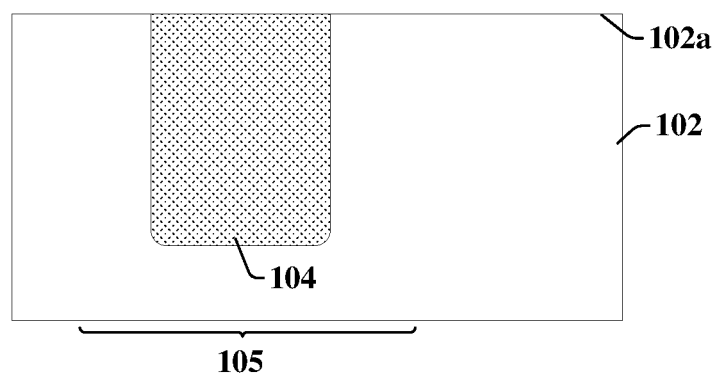
FIGS. 21-30 illustrate some additional embodiments of a method of forming a multi-dimensional integrated chip comprising an image sensor IC having a BTI structure with a conductive core.

As shown in cross-sectional view 2100 of FIG. 21, a substrate 102 is provided. An image sensing element 104 is formed within a pixel region 105 of the substrate 102. In some embodiments, the image sensing element 104 may comprise a photodiode formed by implanting one or more dopant species into the first side 102a of the substrate 102.

Figure 22:
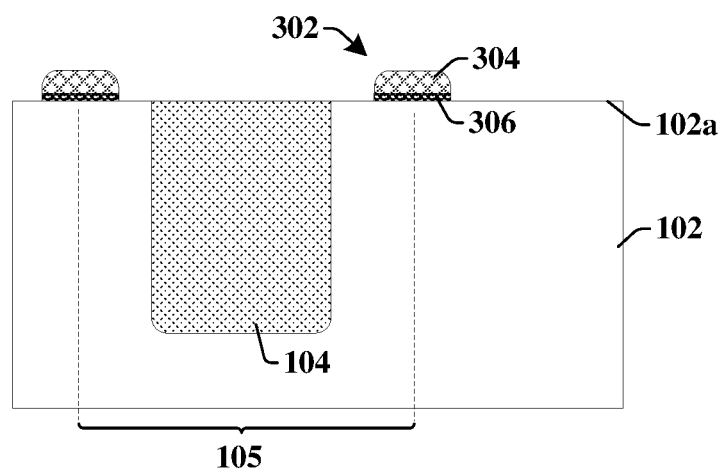

As shown in cross-sectional view 2200 of FIG. 22, one or more gate structures 302 are formed onto the first side 102a of the substrate 102 and along opposing sides of the pixel region 105. The one or more gate structures 302 are formed to respectively comprise a gate electrode 304 separated from the substrate 102 by a gate dielectric 306. In some embodiments, the one or more gate structures 302 may be formed by depositing a gate dielectric layer and a gate electrode layer over the substrate 102, followed by a subsequent patterning process.

Figure 23:
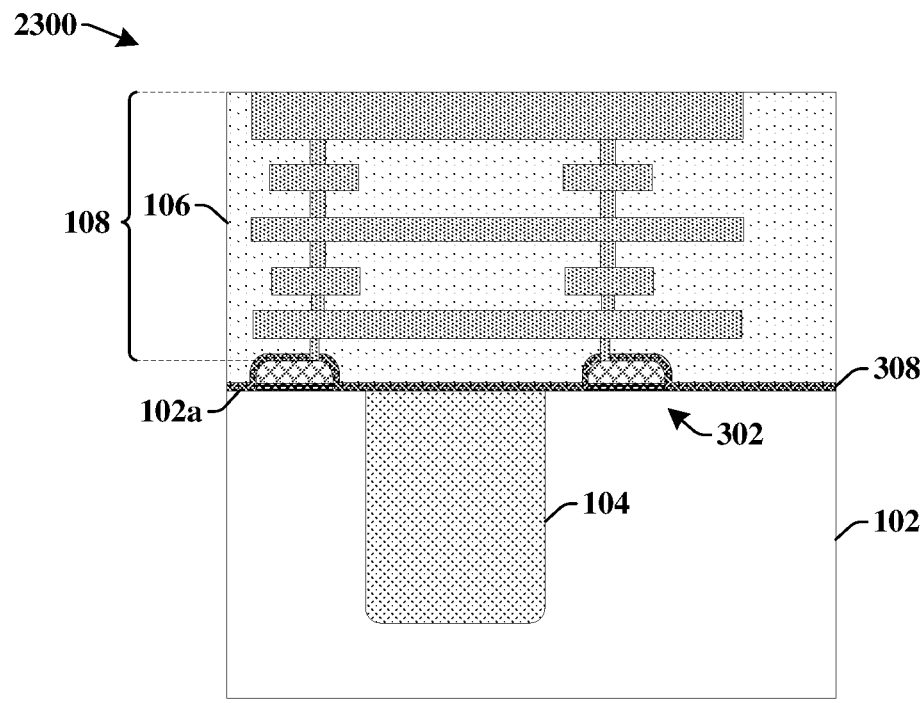

As shown in cross-sectional view 2300 of FIG. 23, a CESL 308 is formed onto the first side 102a of the substrate 102 and over the one or more gate structures 302. One or more interconnects 108 are subsequently formed within an ILD structure 106 formed on the CESL 308. The ILD structure 106 comprises a plurality of stacked ILD layers, while the one or more interconnects 108 comprise alternating layers of conductive wires and vias. In some embodiments, the substrate 102 may be thinned after forming the ILD structure 106 (e.g., as described in relation to FIG. 13).

Figure 24:
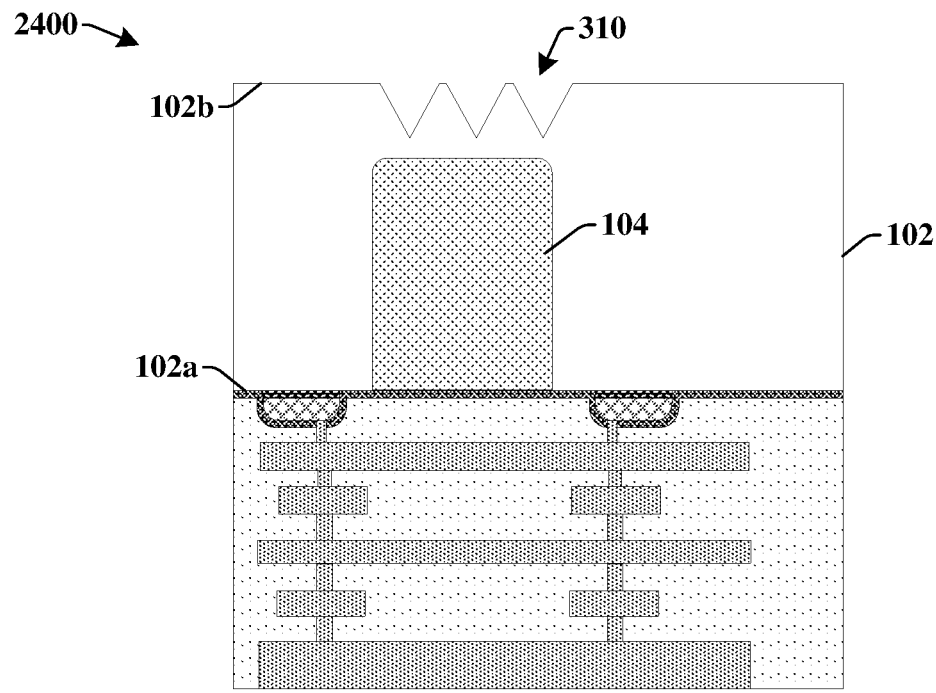

As shown in cross-sectional view 2400 of FIG. 24, a plurality of recesses 310 are formed within the second side 102b of the substrate 102. The plurality of recesses 310 are formed directly over the image sensing element 104. In some embodiments, the plurality of recesses 310 may be formed by a patterning process, as described in relation to FIG. 14.

Figure 25:
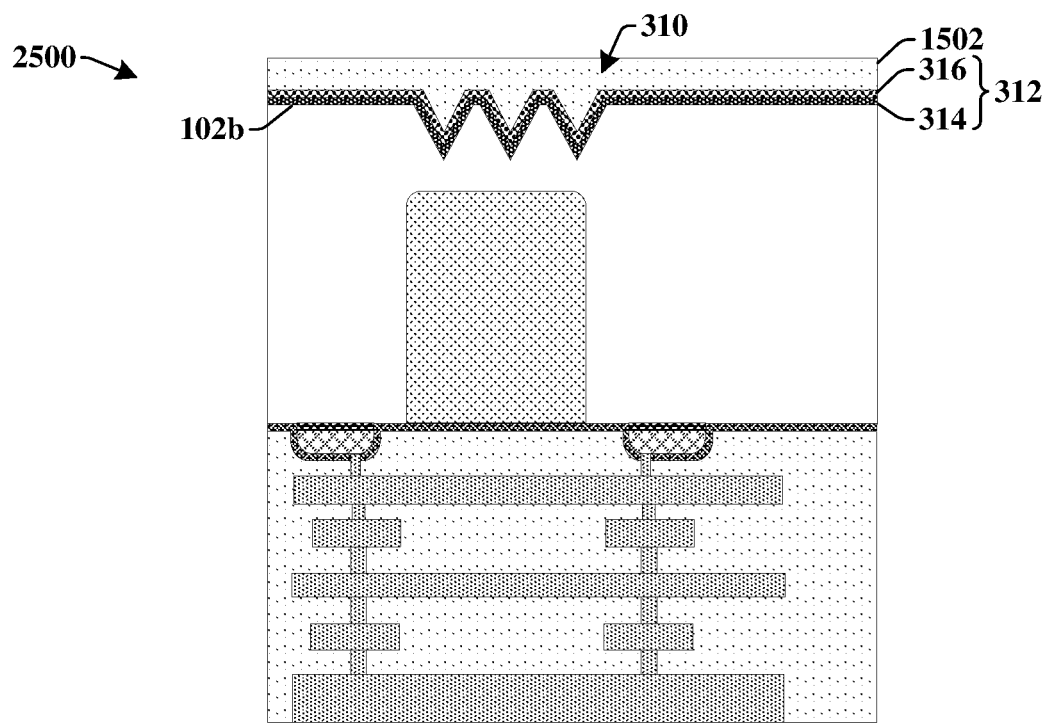

As shown in cross-sectional view 2500 of FIG. 25, one or more absorption enhancement layers 312 are formed along the second side 102b of the substrate 102. In some embodiments, the one or more absorption enhancement layers 312 may comprise a first absorption enhancement layer 314 formed along the second side 102b of the substrate 102 and a second absorption enhancement layer 316 formed over the first absorption enhancement layer 314. The first absorption enhancement layer 314 lines the second side 102b of the substrate 102. In some embodiments, the first absorption enhancement layer 314 may comprise a high-k dielectric layer and the second absorption enhancement layer 316 may comprise a dielectric material (e.g., an oxide). A first dielectric layer 1502 is formed over the one or more absorption enhancement layers 312.

Figure 26:
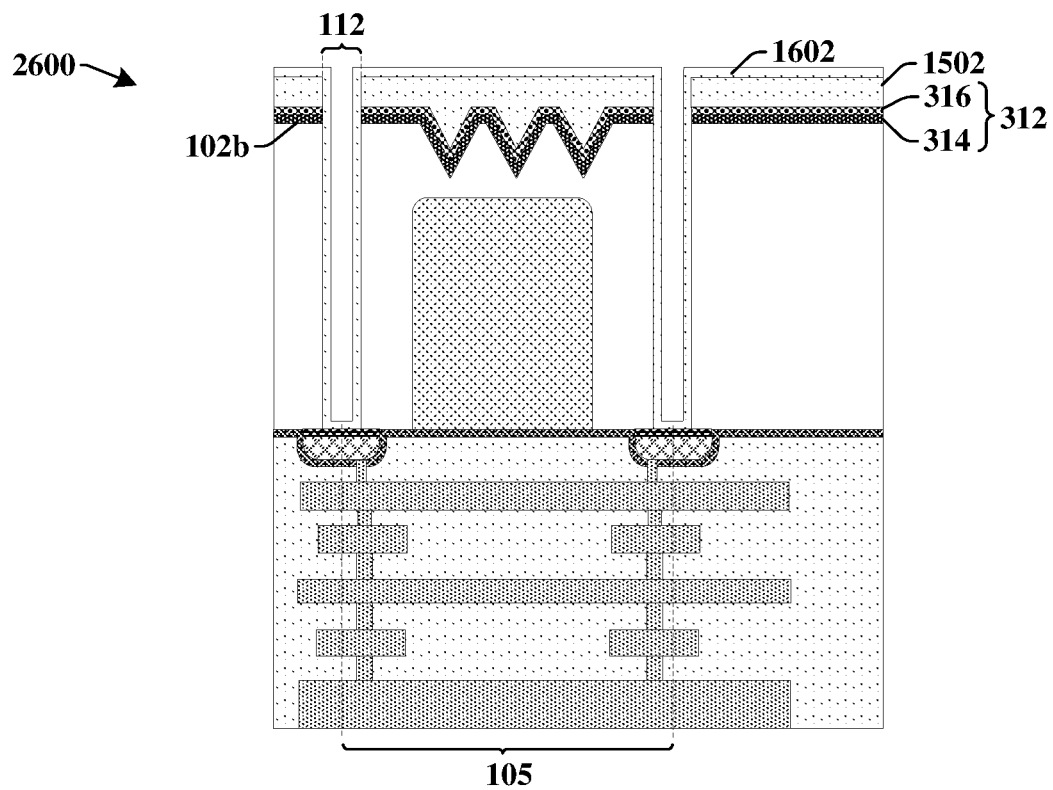

As shown in cross-sectional view 2600 of FIG. 26, one or more trenches 112 are formed within the second side 102b of the substrate 102. The one or more trenches 112 vertically extend from the second side 102b of the substrate 102 to within the substrate 102 on opposing sides of the image sensing element 104 and along opposing sides of the pixel region 105. In some embodiments, the one or more trenches 112 are formed directly over the one or more gate structures 302. In some embodiments, the one or more trenches 112 may be formed by selectively etching the second side 102b of the substrate 102. A second dielectric layer 1602 is formed on the second side 102b of the substrate 102 and within the one or more trenches 112. The second dielectric layer 1602 may be formed to conformally line sidewalls of the substrate 102 defining the one or more trenches 112 and horizontally extending surfaces of the first dielectric layer 1502 and the gate dielectric 406.

Figure 27:
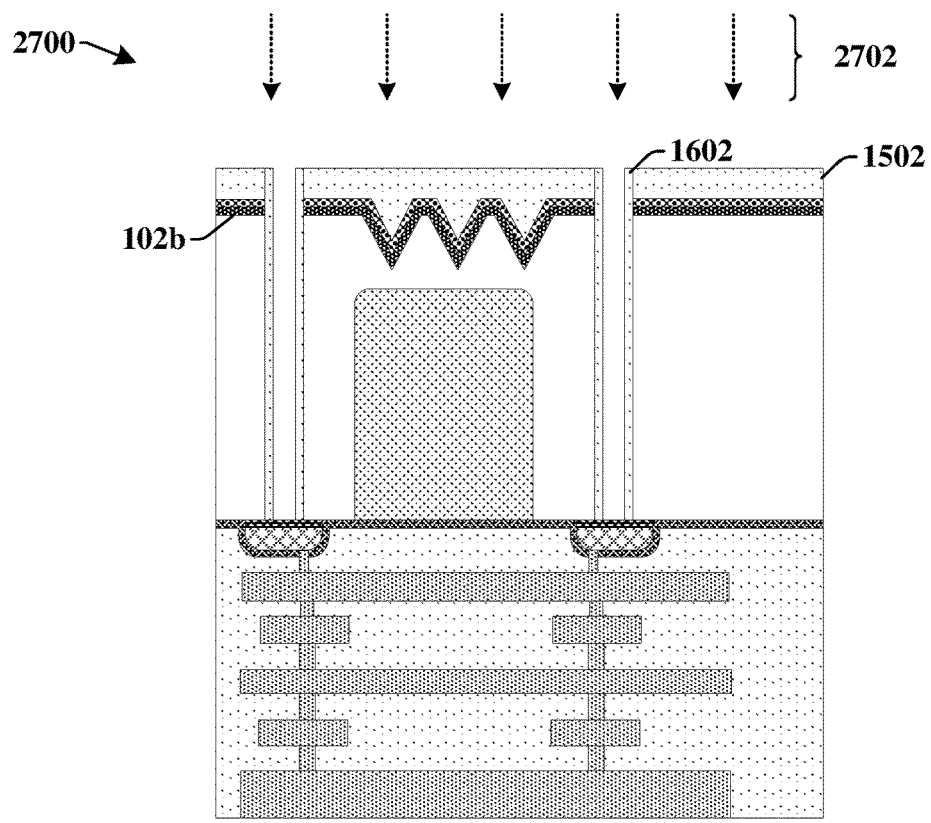

As shown in cross-sectional view 2700 of FIG. 27, the second dielectric layer 1602 is exposed to one or more etchants 2702 (e.g., a dry etchant), which remove a part of the second dielectric layer 1602 from horizontal surfaces. Removing the part of the second dielectric layer 1602 from horizontal surfaces leaves a part of the second dielectric layer 1602 along sidewalls of the substrate 102 that form the one or more trenches 112.

Figure 28:
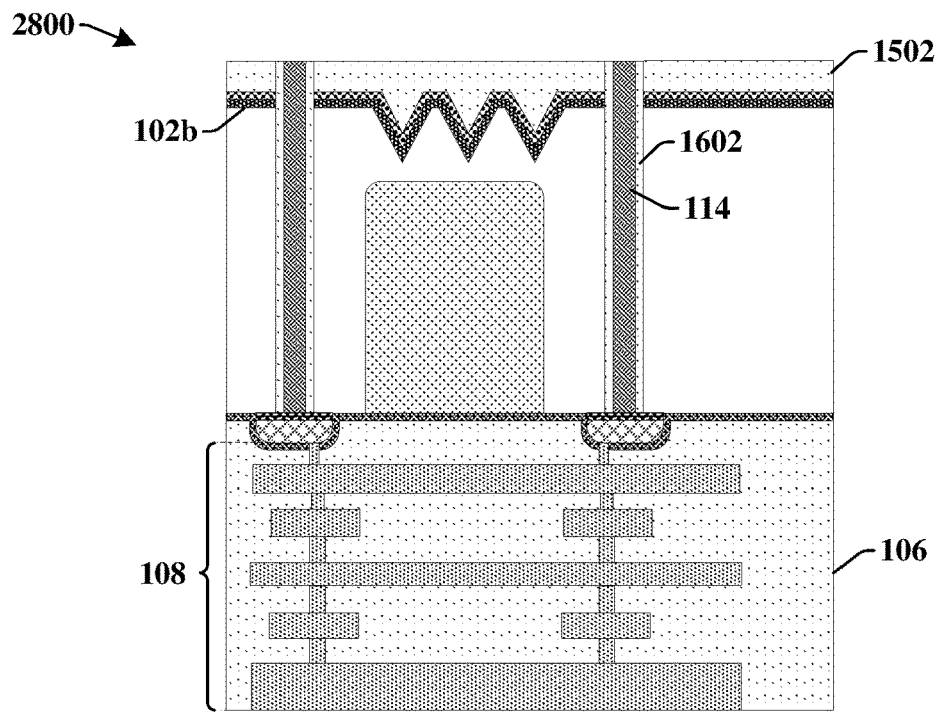

As shown in cross-sectional view 2800 of FIG. 28, a conductive core 114 is formed within the one or more trenches 112 between sidewalls of the second dielectric layer 1602. The conductive core 114 is formed to be electrically coupled to the one or more interconnects 108 within the ILD structure 106. In some embodiments, the conductive core 114 may be formed by forming a conductive material within the one or more trenches 112. A planarization process (e.g., a chemical mechanical planarization process) is subsequently performed to remove a part of the conductive material from over the first dielectric layer 1502 and the second dielectric layer 1602.

Figure 29:
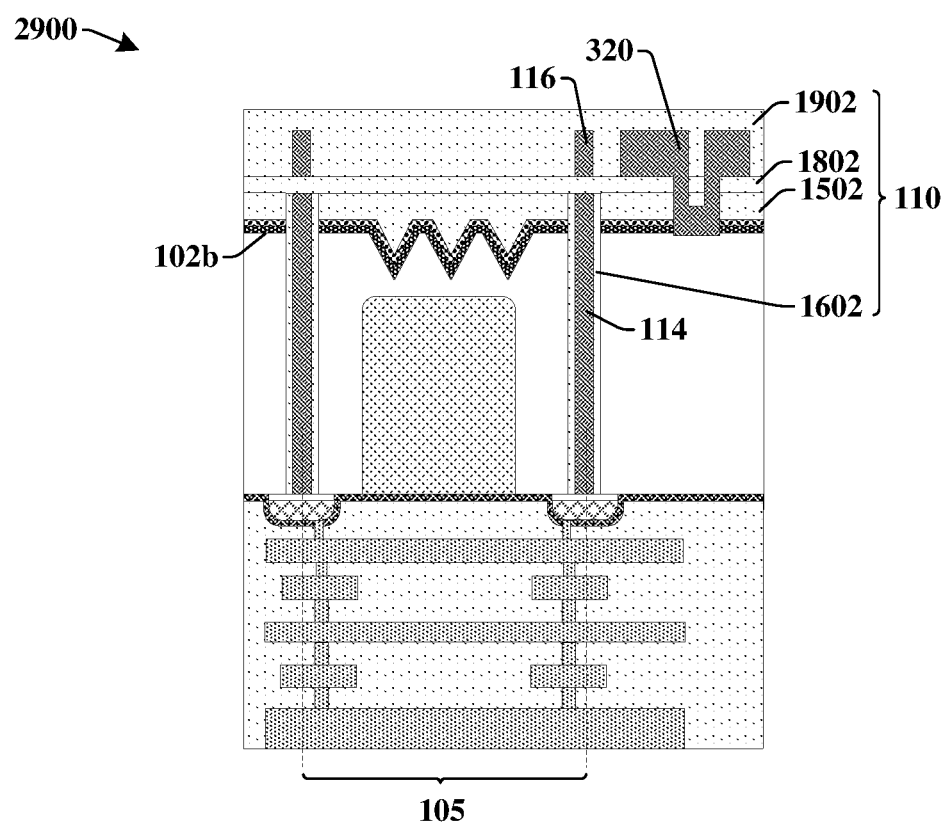

As shown in cross-sectional view 2900 of FIG. 29, a third dielectric layer 1802 is formed onto the first dielectric layer 1502, the second dielectric layer 1602, and the conductive core 114. A grid structure 116 is formed on the third dielectric layer 1802. The grid structure 116 may comprise a metal that is formed directly over the conductive core 114. In some embodiments, the grid structure 116 may be formed by a deposition process and/or a plating process followed by an etching process. In some embodiments, a conductive shield 318 may be formed on the third dielectric layer 1802 outside of the pixel region. In some embodiments, the conductive shield 318 may be formed concurrent to the grid structure 116. A fourth dielectric layer 1902 is formed over the grid structure 116 and/or the conductive shield 318.

Figure 30:
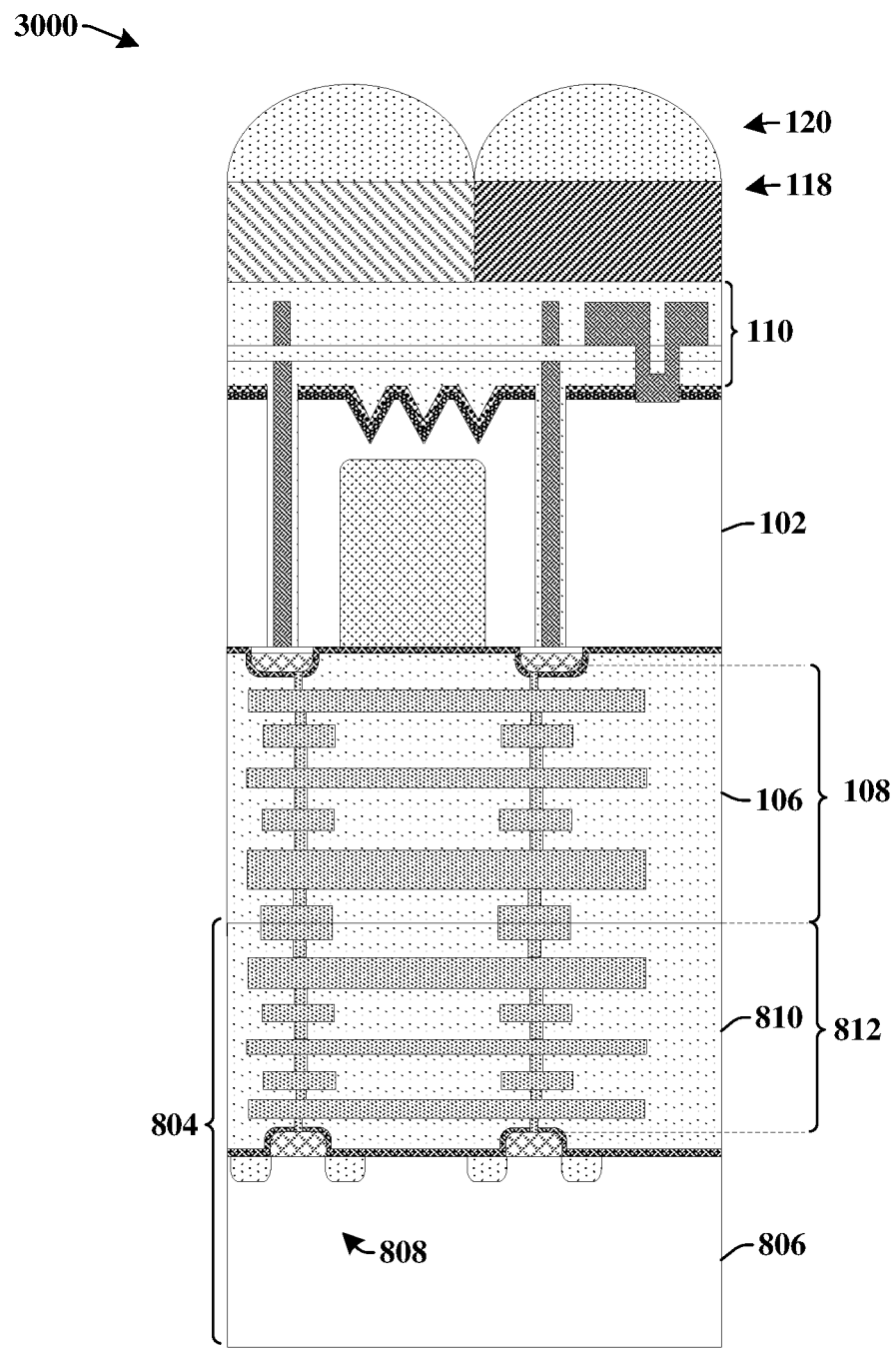

As shown in cross-sectional view 3000 of FIG. 30, the ILD structure 106 is bonded to a second IC die 804. The second IC die 804 comprises one or more semiconductor device 808 disposed within a second substrate 806. One or more second interconnects 812 are arranged within a second ILD structure 810 on the second substrate 806. The ILD structure 106 is bonded to the second ILD structure 810 along a hybrid bonding interface. After bonding the ILD structure 106 to the second IC die 804, a color filter 118 may be formed onto the dielectric structure 110, and a micro-lens 120 may subsequently be formed onto the color filter 118.

FIGS. 31-39 illustrate some additional embodiments of a method of forming a multi-dimensional integrated chip comprising an image sensor IC having a BTI structure with a conductive core. Although FIGS. 31-39 are described in relation to a method, it will be appreciated that the structures disclosed in FIGS. 31-39 are not limited to such a method, but instead may stand alone as structures independent of the method.

Figure 31:
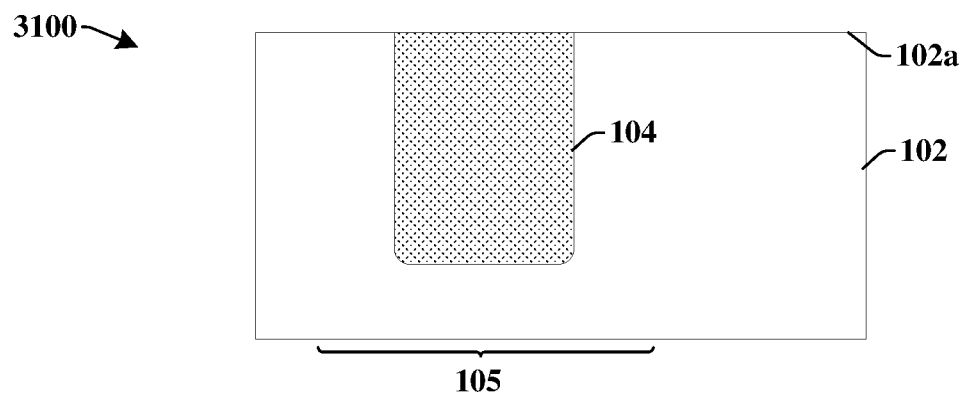
FIGS. 31-39 illustrate some additional embodiments of a method of forming a multi-dimensional integrated chip comprising an image sensor IC having a BTI structure with a conductive core.

As shown in cross-sectional view 3100 of FIG. 31, a substrate 102 is provided. An image sensing element 104 is formed within a pixel region 105 of the substrate 102. In some embodiments, the image sensing element 104 may comprise a photodiode formed by implanting one or more dopant species into the first side 102a of the substrate 102.

Figure 32:
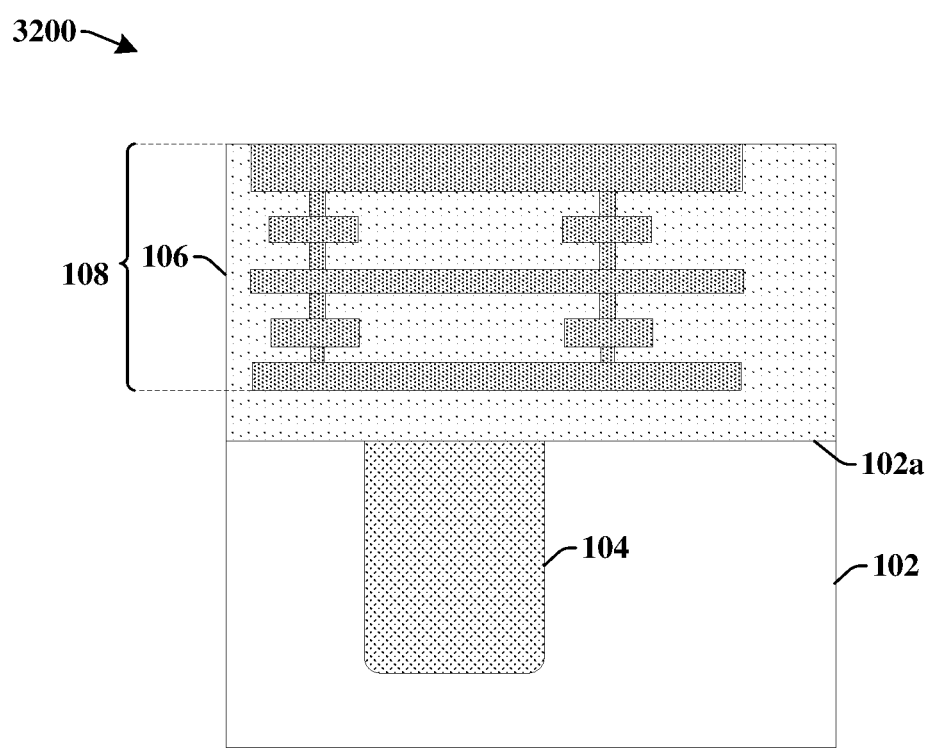

As shown in cross-sectional view 3200 of FIG. 32, one or more interconnects 108 are formed within an ILD structure 106 formed on the first side 102a of the substrate 102. The ILD structure 106 comprises a plurality of stacked ILD layers, while the one or more interconnects 108 comprise alternating layers of conductive wires and vias. In some embodiments, the one or more interconnects 108 may be formed using a damascene process (e.g., a single damascene process or a dual damascene process).

Figure 33:
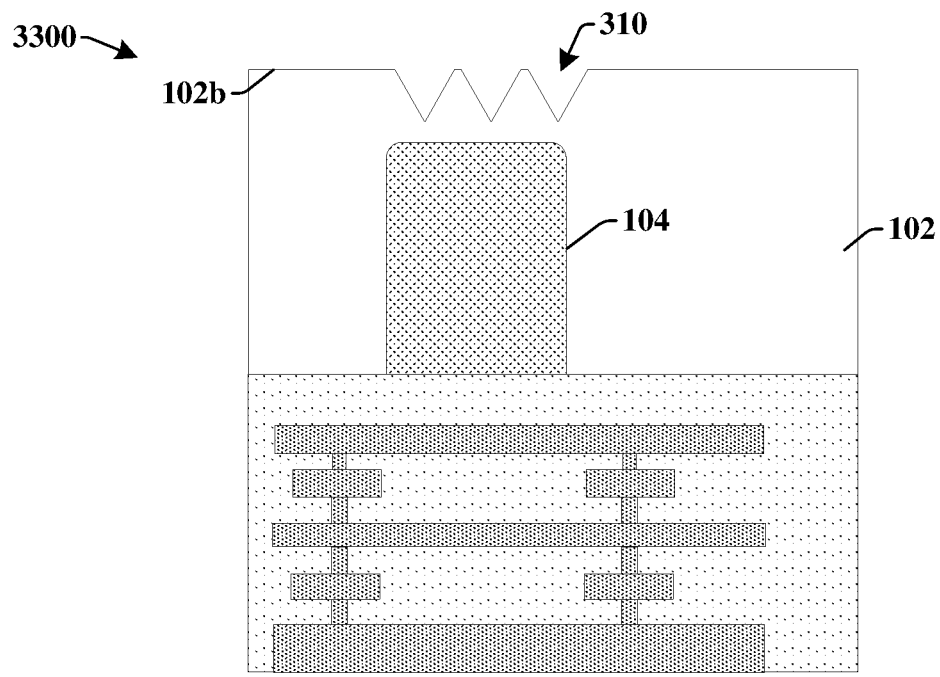

As shown in cross-sectional view 3300 of FIG. 33, a plurality of recesses 310 are formed within the second side 102b of the substrate 102. In some embodiments, the plurality of recesses 310 may be formed by a patterning process, as described in relation to FIG. 14.

Figure 34:
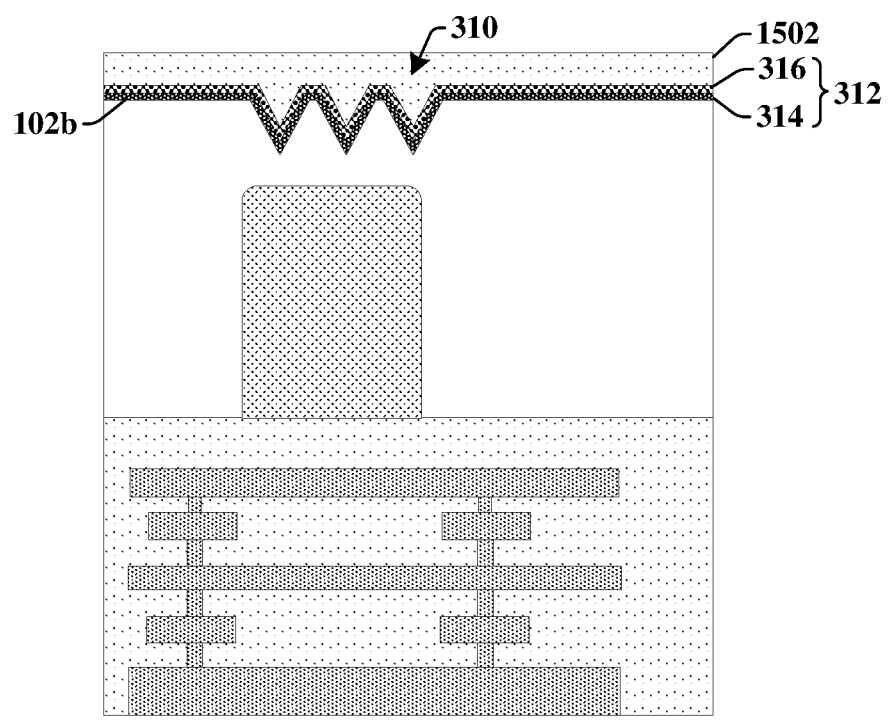

As shown in cross-sectional view 3400 of FIG. 34, one or more absorption enhancement layers 312 are formed along the second side 102b of the substrate 102. In some embodiments, the one or more absorption enhancement layers 312 may comprise a first absorption enhancement layer 314 formed along the second side 102b of the substrate 102 and a second absorption enhancement layer 316 formed over the first absorption enhancement layer 314. The first absorption enhancement layer 314 lines the second side 102b of the substrate 102. In some embodiments, the first absorption enhancement layer 314 may comprise a high-k dielectric layer and the second absorption enhancement layer 316 may comprise a dielectric material. A first dielectric layer 1502 is formed over the one or more absorption enhancement layers 312.

Figure 35:
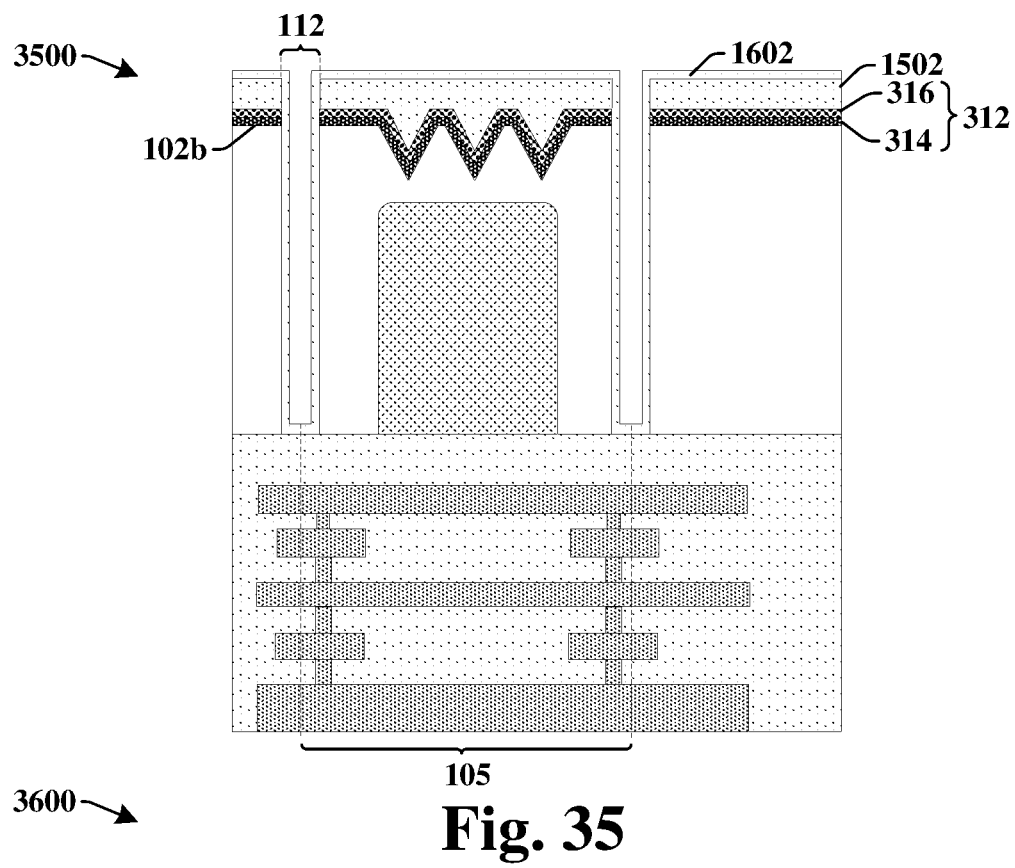

As shown in cross-sectional view 3500 of FIG. 35, one or more trenches 112 are formed within the second side 102b of the substrate 102. The one or more trenches 112 vertically extend from the second side 102b of the substrate 102 to within the substrate 102 on opposing sides of the image sensing element 104 and along opposing sides of the pixel region 105. In some embodiments, the one or more trenches 112 may be formed by selectively etching the second side 102b of the substrate 102. A second dielectric layer 1602 is formed on the second side 102b of the substrate 102 and within the one or more trenches 112. The second dielectric layer 1602 may be formed to conformally line sidewalls of the substrate 102 and horizontally extending surfaces of the first dielectric layer 1502 and the gate dielectric 406.

Figure 36:
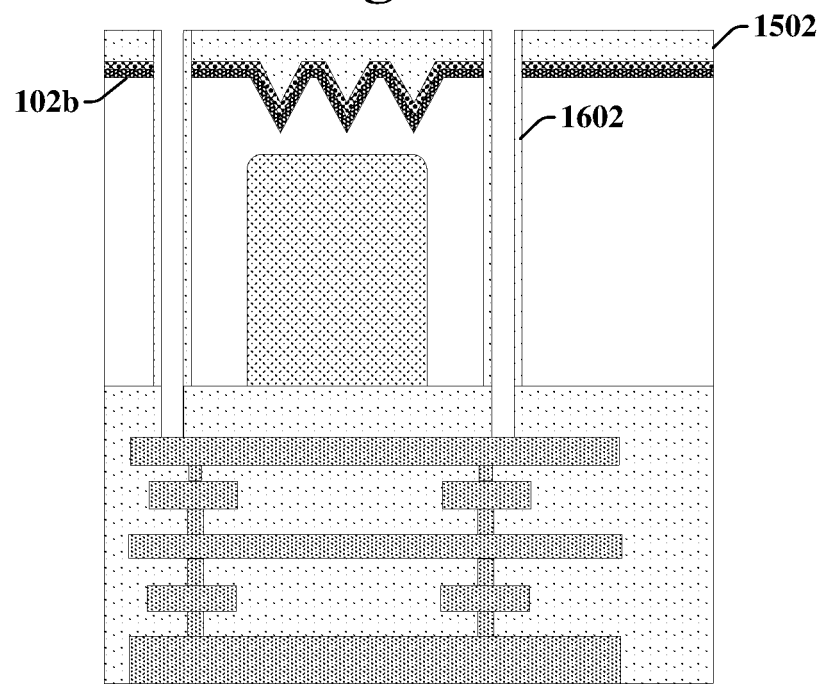

As shown in cross-sectional view 3600 of FIG. 36, the second dielectric layer 1602 is exposed to one or more etchants (e.g., a dry etchant), which remove a part of the second dielectric layer 1602 from horizontal surfaces. Removing the part of the second dielectric layer 1602 from horizontal surfaces, leaves a part of the second dielectric layer 1602 along sidewalls of the substrate 102 that form the one or more trenches 112.

Figure 37:
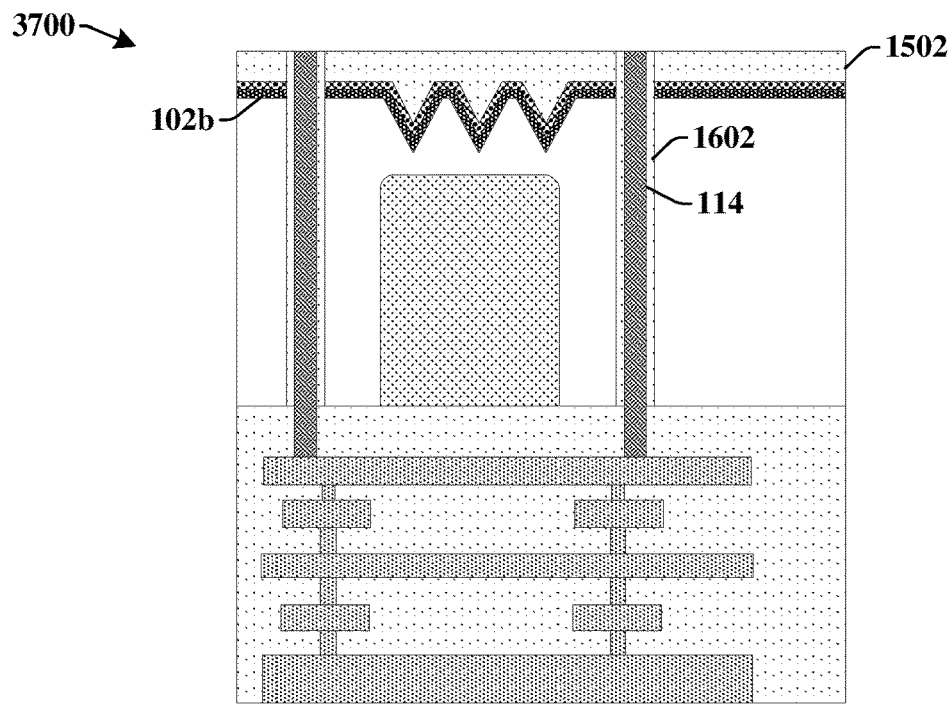

As shown in cross-sectional view 3700 of FIG. 37, a conductive core 114 is formed within the one or more trenches 112 between sidewalls of the second dielectric layer 1602. In some embodiments, the conductive core 114 may be formed by forming a conductive material within the one or more trenches 112. A planarization process (e.g., a chemical mechanical planarization process) is subsequently performed to remove a part of the conductive material from over the first dielectric layer 1502 and the second dielectric layer 1602.

Figure 38:
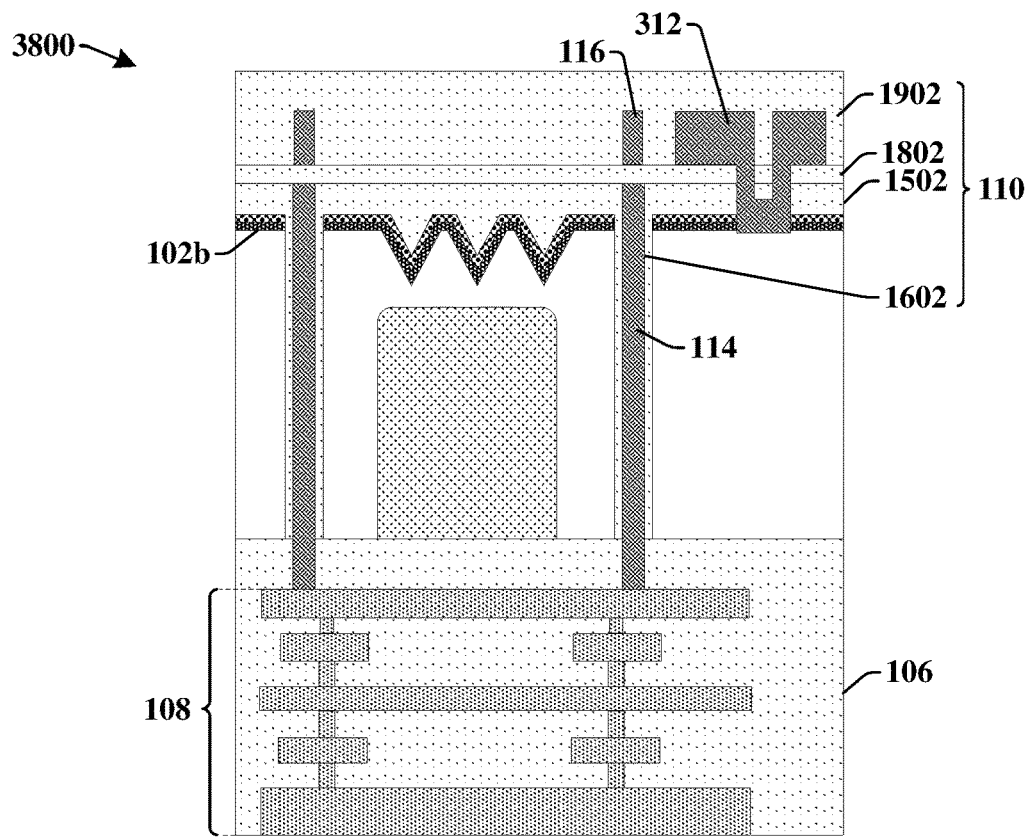

As shown in cross-sectional view 3800 of FIG. 38, a third dielectric layer 1802 is formed onto the first dielectric layer 1502, the second dielectric layer 1602, and the conductive core 114. A grid structure 116 is formed on the third dielectric layer 1802. The grid structure 116 may comprise a metal that is formed directly over the conductive core 114. In some embodiments, the grid structure 116 may be formed by a deposition process and/or a plating process followed by an etching process. In some embodiments, a conductive shield 318 may be formed on the third dielectric layer 1802 outside of the pixel region. In some embodiments, the conductive shield 318 may be formed concurrent to the grid structure 116. A fourth dielectric layer 1902 is formed over the grid structure 116 and/or the conductive shield 318.

Figure 39:
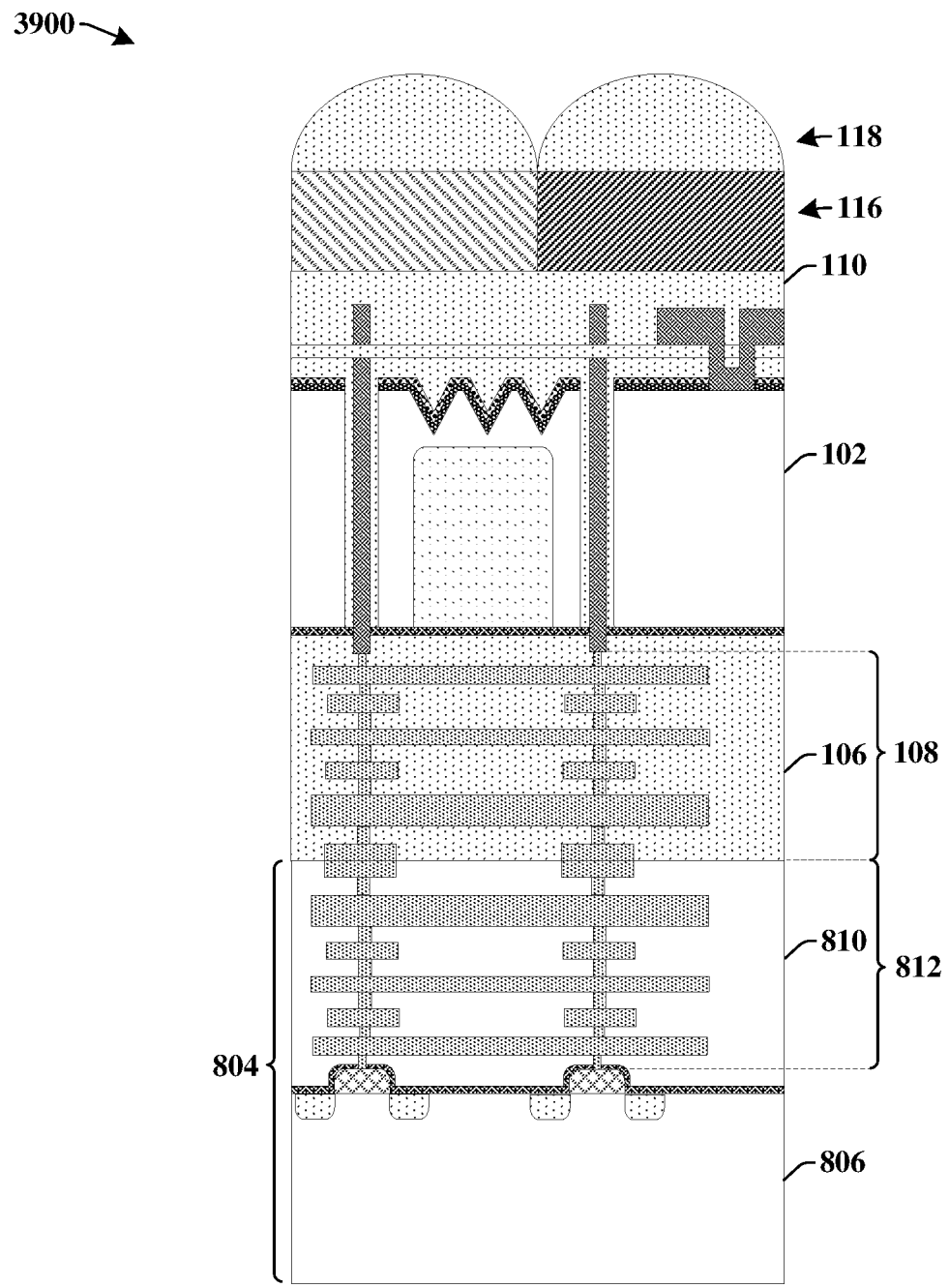

As shown in cross-sectional view 3900 of FIG. 39, the ILD structure 106 is bonded to a second IC die 804. The second IC die 804 comprises one or more semiconductor device 808 disposed within a second substrate 806. One or more second interconnects 812 are arranged within a second ILD structure 810 on the second substrate 806. The ILD structure 106 is bonded to the second ILD structure 810 along a hybrid bonding interface. After bonding the ILD structure 106 to the second IC die 804, a color filter 118 may be formed onto the dielectric structure 110, and a micro-lens 120 may subsequently be formed onto the color filter 118.

Figure 40:
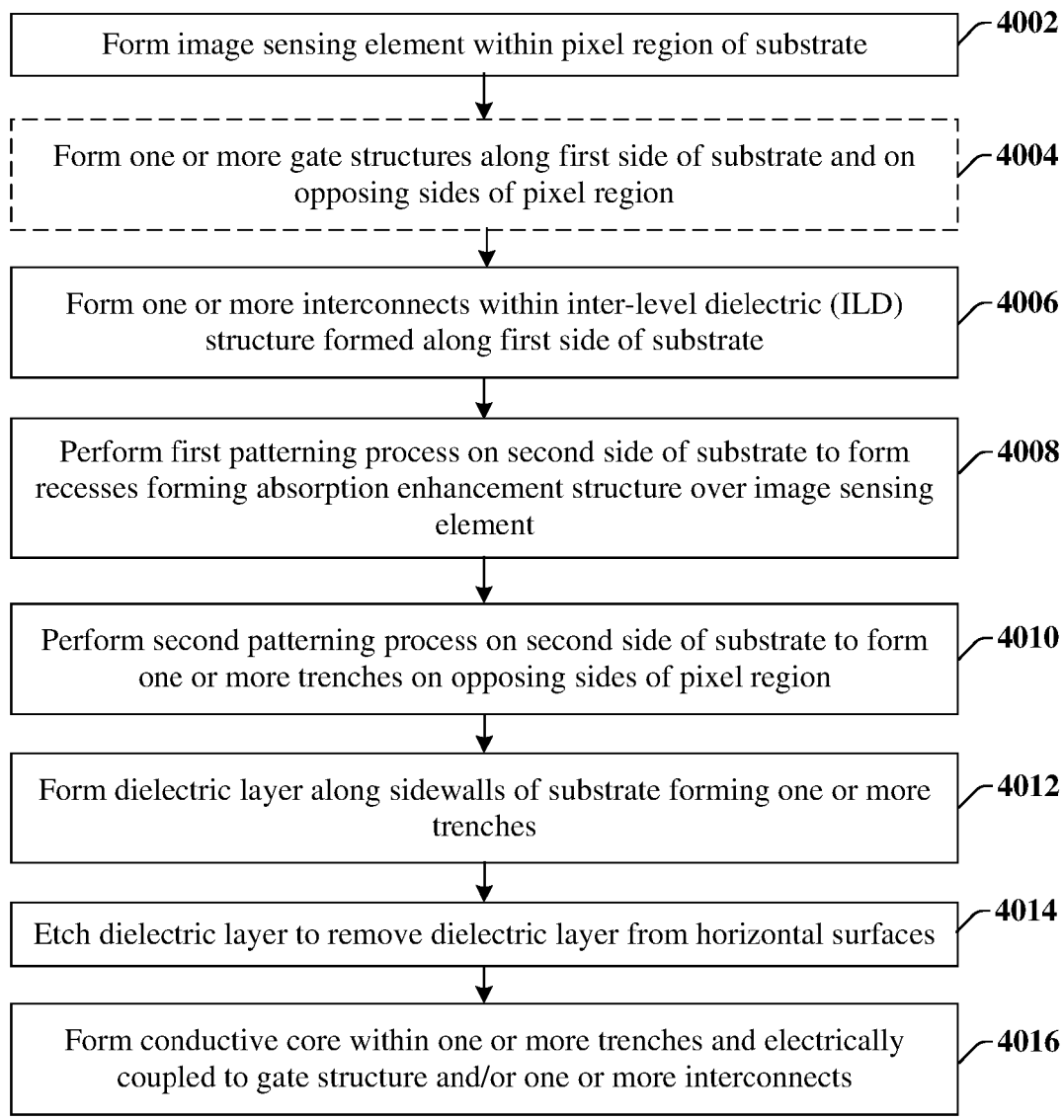
FIG. 40 illustrates a flow diagram of some embodiments of a method of forming an image sensor IC having an image sensing element surrounded by a BTI structure with a conductive core.

FIG. 40 illustrates a flow diagram of some embodiments of a method 4000 of forming an image sensor IC having an image sensing element surrounded by a BTI structure with a conductive core.

While method 4000 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 4002, an image sensing element is formed within a pixel region of a substrate. FIGS. 9, 21, and 31 illustrate cross-sectional views 900, 2100, and 3100 of various embodiments corresponding to act 4002.

At act 4004, one or more gate structures may be formed along a first side of the substrate, and along opposing sides of the pixel region, in some embodiments. FIGS. 10-11 illustrate cross-sectional views 1000-1100 of some embodiments corresponding to act 4004. FIG. 22 illustrates a cross-sectional view 2200 of some alternative embodiments corresponding to act 4004.

At act 4006, one or more interconnects are formed within an inter-level dielectric (ILD) structure formed along the first side of the substrate. FIGS. 12, 23, and 32 illustrate cross-sectional views 1200, 2300, and 3200 of various embodiments corresponding to act 4006.

At act 4008, a first patterning process is performed on a second side of the substrate to form a plurality of recesses forming an absorption enhancement structure over the image sensing element. FIGS. 13, 24, and 33 illustrate cross-sectional views 1300, 2400, and 3300 of various embodiments corresponding to act 4008.

At act 4010, a second patterning process is performed on the second side of the substrate to form one or more trenches on opposing sides of pixel region. FIGS. 14, 25, and 34 illustrate cross-sectional views 1400, 2500, and 3400 of various embodiments corresponding to act 4010.

At act 4012, a dielectric layer is formed along sidewalls of the substrate forming the one or more trenches. FIGS. 15, 26, and 35 illustrate cross-sectional views 1500, 2600, and 3500 of various embodiments corresponding to act 4012.

At act 4014, the dielectric layer is etched to remove the dielectric layer from horizontal surfaces. FIGS. 16, 27, and 36 illustrate cross-sectional views 1600, 2700, and 3600 of various embodiments corresponding to act 4014.

At act 4016, a conductive core is formed within the one or more trenches and in electrical contact with the one or more gate structures and/or the one or more interconnects. FIGS. 17, 28, and 37 illustrate cross-sectional views 1700, 2800, and 3700 of various embodiments corresponding to act 4016.

Accordingly, in some embodiments, the present disclosure relates to an image sensor integrated chip (IC) comprising a back-side deep trench isolation structure that is arranged within a trench in a substrate and that has a conductive core. The conductive core is electrically coupled to a biasing source that is configured to apply a bias voltage to the conductive core to passivate defects within sidewalls of the substrate defining the trench.

In some embodiments, the present disclosure relates to an image sensor integrated chip (IC), including one or more interconnects arranged within an inter-level dielectric (ILD) structure on a first side of a substrate; an image sensing element arranged within the substrate, sidewalls of the substrate forming one or more trenches extending from a second side of the substrate to within the substrate on opposing sides of the image sensing element; a dielectric structure arranged on the sidewalls of the substrate that form the one or more trenches; a conductive core arranged within the one or more trenches and laterally separated from the substrate by the dielectric structure; and the conductive core being electrically coupled to the one or more interconnects. In some embodiments, the image sensor IC further includes one or more gate structures arranged along the first side of the substrate, the conductive core contacting the one or more gate structures. In some embodiments, the one or more gate structures are directly between additional sidewalls of the substrate. In some embodiments, the conductive core physically contacts a surface of the one or more gate structures that faces away from the ILD structure. In some embodiments, the conductive core vertically protrudes outward from the first side of the substrate to physically contact the one or more interconnects. In some embodiments, the image sensor IC further includes a biasing source coupled to the conductive core by way of the one or more interconnects, the biasing source being configured to selectively apply a bias voltage to the conductive core. In some embodiments, the conductive core extends vertically past a bottom of the dielectric structure that faces the ILD structure and that is within the one or more trenches. In some embodiments, the conductive core vertically protrudes outward past an upper surface of the substrate that faces away from the ILD structure. In some embodiments, the image sensor IC further includes a grid structure arranged directly over the conductive core, wherein the dielectric structure is arranged between a top of the conductive core and a bottom of the grid structure.

In other embodiments, the present disclosure relates to an image sensor integrated chip (IC), including one or more interconnects arranged within an ILD structure on a first side of a substrate; an image sensing element arranged within the substrate; a conductive core extending from a second side of the substrate to within the substrate on opposing sides of the image sensing element, the conductive core being electrically coupled to the one or more interconnects; and a biasing source coupled to the conductive core by way of the one or more interconnects, the biasing source being configured to selectively apply a bias voltage to the conductive core. In some embodiments, the conductive core continuously extends from within the substrate to a non-zero distance past the second side of the substrate. In some embodiments, the substrate further includes a plurality of angled sidewalls that define one or more triangular shaped cavities within the second side of the substrate, the one or more triangular shaped cavities being directly vertically over the image sensing element and laterally between sidewalls of the conductive core. In some embodiments, the image sensor IC further includes one or more gate structures arranged along the first side of the substrate and electrically coupled to the one or more interconnects, the conductive core extending into the one or more gate structures. In some embodiments, the one or more gate structures include a gate electrode and a gate dielectric that separates the gate electrode from the substrate; and the conductive core extends through the gate dielectric to physically contact the gate electrode. In some embodiments, the conductive core wraps around the image sensing element in a closed and continuously loop as viewed in a top-view. In some embodiments, the image sensor IC further includes one or more absorption enhancement layers arranged along the second side of the substrate, the substrate having angled sidewalls that are directly over the image sensing element and the one or more absorption enhancement layers lining the angled sidewalls; and the conductive core being arranged within one or more trenches defined by sidewalls of the substrate, the one or more absorption enhancement layers being entirely outside of one or more trenches.

In yet other embodiments, the present disclosure relates to a method of forming an image sensor integrated chip (IC), including forming an image sensing element within a substrate; forming one or more interconnects within an ILD structure formed along a first side of the substrate; forming one or more trenches extending into a second side of the substrate along opposing sides of the image sensing element; forming a dielectric layer along sidewalls of the substrate forming the one or more trenches; and forming a conductive core within the one or more trenches, the conductive core extending from within the one or more trenches to be electrically coupled to the one or more interconnects. In some embodiments, the method further includes forming the dielectric layer along the second side of the substrate and along the sidewalls of the substrate that form the one or more trenches; etching the dielectric layer to remove the dielectric layer from horizontal surfaces; and forming the conductive core after etching the dielectric layer. In some embodiments, the method further includes forming one or more gate structures along the first side of the substrate and on opposing sides of the image sensing element; forming the one or more trenches to extend through the substrate and to expose the one or more gate structures; forming the dielectric layer over the one or more gate structures; and forming the conductive core to extend through the dielectric layer and to contact the one or more gate structures. In some embodiments, the conductive core protrudes outward from the second side of the substrate to a non-zero distance above the second side of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an image sensor integrated chip (IC), comprising:
    forming an image sensing element within a substrate;
    forming one or more interconnects within an inter-level dielectric (ILD) structure formed along a first side of the substrate;
    forming one or more trenches extending into a second side of the substrate along opposing sides of the image sensing element;
    forming a dielectric layer along sidewalls of the substrate forming the one or more trenches;
    forming a conductive core between sidewalls of the dielectric layer, wherein the conductive core extends from over the second side of the substrate to be electrically coupled to the one or more interconnects;
    forming a second dielectric layer onto a top of the conductive core; and
    forming a metal grid structure laterally outside of the image sensing element and vertically above the conductive core, wherein the second dielectric layer is vertically between the top of the conductive core and a bottom of the metal grid structure.

2. The method of claim 1, further comprising:
    etching the dielectric layer to remove the dielectric layer from horizontal surfaces; and
    forming the conductive core after etching the dielectric layer.

3. The method of claim 1, further comprising:
    forming one or more gate structures along the first side of the substrate and on opposing sides of the image sensing element;
    forming the one or more trenches to extend through the substrate and to expose the one or more gate structures;
    forming the dielectric layer over the one or more gate structures; and
    forming the conductive core to extend through the dielectric layer and to contact the one or more gate structures.

4. The method of claim 1, wherein the conductive core contacts the second dielectric layer along an interface that is a non-zero distance above the second side of the substrate.

5. The method of claim 1, wherein the second dielectric layer vertically contacts the top of the conductive core and the bottom of the metal grid structure.

6. A method of forming an integrated chip, comprising:
    forming one or more interconnects within an ILD structure formed along a first side of a substrate;
    forming one or more gate structures along the first side of the substrate;
    forming one or more absorption enhancement layers along a second side of the substrate opposing the first side of the substrate;
    forming a dielectric over the one or more absorption enhancement layers;
    forming one or more trenches extending through the one or more absorption enhancement layers, the dielectric, and the substrate to expose the one or more gate structures along opposing sides of an image sensing region;
    forming a first dielectric layer along sidewalls of the substrate forming the one or more trenches and over the one or more gate structures; and
    forming a conductive core within the one or more trenches and to extend through the first dielectric layer and to contact the one or more gate structures, wherein the conductive core is arranged directly between the sidewalls of the substrate, sidewalls of the dielectric, and sidewalls of the one or more absorption enhancement layers.

7. The method of claim 6, wherein the one or more absorption enhancement layers comprise a high-k dielectric material.

8. The method of claim 6, wherein the one or more trenches expose a sidewall of the one or more gate structures.

9. The method of claim 6, wherein the conductive core extends to a first non-zero distance past the first side of the substrate and to a second non-zero distance past the second side of the substrate.

10. The method of claim 6, wherein the one or more absorption enhancement layers are entirely laterally outside of the one or more trenches.

11. The method of claim 6,
    wherein the one or more gate structures comprise one or more recessed gate structures; and
    wherein the conductive core contacts the one or more recessed gate structures along an interface that is directly between the sidewalls of the substrate.

12. The method of claim 6, further comprising:
    forming a second dielectric layer over the dielectric and the first dielectric layer; and
    forming a grid structure directly over the second dielectric layer and the conductive core.

13. The method of claim 6, wherein the substrate further comprises a plurality of angled sidewalls that form one or more triangular shaped cavities within the second side of the substrate, the one or more triangular shaped cavities being directly vertically over the image sensing region and laterally between sidewalls of the conductive core.

14. The method of claim 6, wherein the conductive core wraps around the image sensing region in a closed and continuous loop as viewed in a top-view.

15. A method of forming an integrated chip, comprising:
    forming one or more interconnects within an ILD structure formed along a first side of a substrate;
    forming one or more trenches into a second side of the substrate along opposing sides of an image sensing region;
    forming a dielectric layer along sidewalls of the substrate forming the one or more trenches and over the second side of the substrate;
    forming a metal within the one or more trenches and along sidewalls of the dielectric layer, wherein the metal protrudes outward from the second side of the substrate to a top surface that is a non-zero distance over the second side of the substrate and wherein the metal is electrically coupled to the one or more interconnects; and wherein the top surface of the metal wraps around multiple sides of the image sensing region in a top-view.

16. The method of claim 15, wherein the metal protrudes outward from the second side of the substrate to a distance of between approximately 1,000 Angstroms and approximately 5,000 Angstroms.

17. The method of claim 15, further comprising:
forming one or more recessed gate structures along the first side of the substrate and on opposing sides of the image sensing region; and
wherein the metal is formed to vertically overlap the one or more recessed gate structures.

18. The method of claim 15, wherein the top surface of the metal continuously wraps around the multiple sides of the image sensing region in a closed loop.

19. The method of claim 15, further comprising:
forming one or more recessed gate structures along the first side of the substrate;
forming the one or more trenches to expose the one or more recessed gate structures; and
wherein the metal contacts the one or more recessed gate structures along an interface that is directly between the sidewalls of the substrate.

20. The method of claim 15, wherein the image sensing region comprises a photodiode configured to detect radiation that is in an infrared part of the electromagnetic spectrum.

* * * * *